US012159012B2

United States Patent
Sim et al.

(10) Patent No.: US 12,159,012 B2
(45) Date of Patent: Dec. 3, 2024

(54) DIGITIZER AND DISPLAY APPARATUS INCLUDING THE SAME

(71) Applicant: SAMSUNG DISPLAY CO., LTD., Yongin-si (KR)

(72) Inventors: Jinyong Sim, Yongin-si (KR); Sungchul Choi, Yongin-si (KR); Jaiku Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/228,067

(22) Filed: Jul. 31, 2023

(65) Prior Publication Data

US 2023/0384898 A1    Nov. 30, 2023

Related U.S. Application Data

(63) Continuation of application No. 17/567,593, filed on Jan. 3, 2022, now Pat. No. 11,733,815.

(30) Foreign Application Priority Data

Mar. 8, 2021   (KR) ........................ 10-2021-0030363

(51) Int. Cl.
*G06F 3/044*      (2006.01)
*H10K 50/84*    (2023.01)
(Continued)

(52) U.S. Cl.
CPC .......... *G06F 3/0445* (2019.05); *G06F 3/0446* (2019.05); *H10K 50/84* (2023.02); *H10K 59/122* (2023.02); *H10K 2102/311* (2023.02)

(58) Field of Classification Search
CPC . G06F 3/0445; G06F 3/0446; H01L 27/3246; H01L 51/5237; H01L 2251/5338
See application file for complete search history.

(56) References Cited

U.S. PATENT DOCUMENTS 10,423,019 B1   9/2019  Song
10,495,941 B2  12/2019  Hashimoto et al.
(Continued)

FOREIGN PATENT DOCUMENTS

KR         10-2085235       3/2020
KR      10-2020-0058020      5/2020
(Continued)

OTHER PUBLICATIONS

Wang et al. "Modeling and simulation for a drop-impact analysis of multi-layered printed circuit boards", Microelectronics Reliability 46 (2006), pp. 558-573.

(Continued)

*Primary Examiner* — Deeprose Subedi
(74) *Attorney, Agent, or Firm* — F. CHAU & ASSOCIATES, LLC

(57) ABSTRACT

A display apparatus includes a digitizer and a display panel disposed on the digitizer and including display elements, wherein the digitizer includes a body layer including a glass fiber or a resin, and a pattern layer disposed on the body layer. The display apparatus as described herein increases display quality by hiding the visibility of the pattern layer disposed on the body layer, and increases the folding quality of the display by having and increased rigidity from the digitizer.

20 Claims, 15 Drawing Sheets

(51) Int. Cl.
   *H10K 59/122* (2023.01)
   *H10K 102/00* (2023.01)

(56) References Cited

U.S. PATENT DOCUMENTS

| | | | |
|---|---|---|---|
| 10,976,873 B2 | 4/2021 | Shin et al. | |
| 10,986,731 B2 | 4/2021 | Shin et al. | |
| 2018/0239457 A1* | 8/2018 | He | G06F 3/0443 |
| 2018/0366679 A1* | 12/2018 | Kim | B32B 17/06 |
| 2019/0267430 A1* | 8/2019 | Choi | H10K 77/111 |
| 2020/0163239 A1 | 5/2020 | Yun et al. | |
| 2022/0129094 A1* | 4/2022 | Tatsuno | G06F 1/1652 |
| 2022/0283671 A1 | 9/2022 | Sim et al. | |

FOREIGN PATENT DOCUMENTS

| | | |
|---|---|---|
| KR | 10-2020-0084495 | 7/2020 |
| KR | 10-2020-0103240 | 9/2020 |
| KR | 10-2020-0121519 | 10/2020 |
| KR | 10-2020-0124099 | 11/2020 |

OTHER PUBLICATIONS

Muniyandi et al., "Converting non-metallic printed circuit boards waste into a value added product", Journal of Environmental Health Science & Engineering 2013, 11:2, pp. 1-9.

* cited by examiner

DIGITIZER AND DISPLAY APPARATUS INCLUDING THE SAME

CROSS-REFERENCE TO RELATED APPLICATIONS

This application is a continuation of U.S. patent application Ser. No. 17/567,593 filed on Jan. 3, 2022, which is based on and claims priority under 35 U.S.C. § 119 to Korean Patent Application No. 10-2021-0030363, filed on Mar. 8, 2021, in the Korean Intellectual Property Office, the disclosures of which are incorporated by reference herein in their entireties.

TECHNICAL FIELD

The present disclosure relates to an apparatus, and more particularly, to a digitizer and a display apparatus including the same.

DISCUSSION OF THE RELATED ART

There has been an increase in the use of mobile electronic devices in recent years. Such electronic devices include mobile phones, tablet personal computers (PCs), gaming systems, and the like.

The mobile electronic devices include display apparatuses that support various functions, for example, the ability to display visual information such as images or videos to users. Recently, as parts of the display apparatus such as the driving circuitry have been minimized, the proportion of the display in electronic devices relative to non-display areas has been gradually increased. For example, the borders (e.g. bezels) of the display have gradually decreased in size.

Recent electronic devices have also been developed with bendable displays. Bendable displays have many advantages over flat displays, including increased portability, lighter weight, and thinner dimensions compared to glass panels. However, in some cases, the display quality may be decreased due to visible patterns underneath the display.

SUMMARY

Electronic devices, and particularly electronic devices with touch recognition capabilities, may include a digitizer to convert analog touch signals to digital signals that may be processed by the electronic device. However, when a digitizer arranged under a display panel in a conventional display device includes a polymer resin, the surface quality of a surface of the digitizer may be decreased due to a visible pattern layer of the digitizer, and thus, the visibility of the display panel arranged over the digitizer may also be decreased.

One or more embodiments provide a display apparatus and a digitizer including a glass fiber and a resin so that the surface quality of a surface of the digitizer may be increased and, at the same time, the visibility of a display panel included in the display apparatus may be increased. The embodiments described herein are examples, however, and do not limit the scope of the disclosure.

It should be noted that the effects of the present disclosure are not necessarily limited to those described above, and other effects of the present disclosure will be apparent from the following description, and may be learned by practice of the presented embodiments of the disclosure.

According to one or more embodiments, a display apparatus includes a digitizer, a display panel disposed on the digitizer and including display elements, where the digitizer includes a body layer including a glass fiber or a resin, and a pattern layer disposed on the body layer.

In the present embodiment, the digitizer may have a thickness of about 200 μm to about 350 μm. The body layer may have a thickness of about 50 m to about 80 μm.

In the present embodiment, the digitizer may further include a cover layer disposed on the body layer with a thickness of about 50 μm to about 80 μm. The cover layer and the body layer may include a same material.

In the present embodiment, the digitizer may further include a heat dissipation layer disposed under the body layer. The heat dissipation layer may include a metal and have a thickness of about 50 μm to about 80 μm. The heat dissipation layer may include graphite and have a thickness of about 17 μm to about 30 μm.

In the present embodiment, the digitizer may further include a shielding layer disposed between the body layer and the heat dissipation layer.

In the present embodiment, the display panel may further include a display area and a folding area.

In the present embodiment, the display apparatus may further include a plate disposed between the display panel and the digitizer, and the plate may have a thickness of about 50 μm to about 80 μm.

In the present embodiment, the plate may include a folding structure which at least partially overlaps the folding area in a thickness direction of the digitizer.

In the present embodiment, the display area may include a first display area and a second display area spaced apart from each other with the folding area disposed therebetween.

In the present embodiment, the digitizer may further include a first portion at least partially overlapping the first display area in the thickness direction, and a second portion at least partially overlapping the second display area in the thickness direction.

In the present embodiment, the first portion and the second portion may be spaced apart from each other with a folding axis located in the spacing.

According to one or more embodiments, a digitizer includes a body layer including glass fiber or a resin, and a pattern layer disposed on the body layer. The body layer may have a thickness of about 50 μm to about 80 μm.

In the present embodiment, the display apparatus may further include a cover layer disposed on the body layer and having a thickness of about 50 μm to about 80 μm. The cover layer and the body layer may include a same material.

In the present embodiment, the digitizer may further include a first portion and a second portion spaced apart from each other with a folding axis located in the spacing.

Other aspects, features, and advantages of the disclosure will become more apparent from the drawings, the claims, and the detailed description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
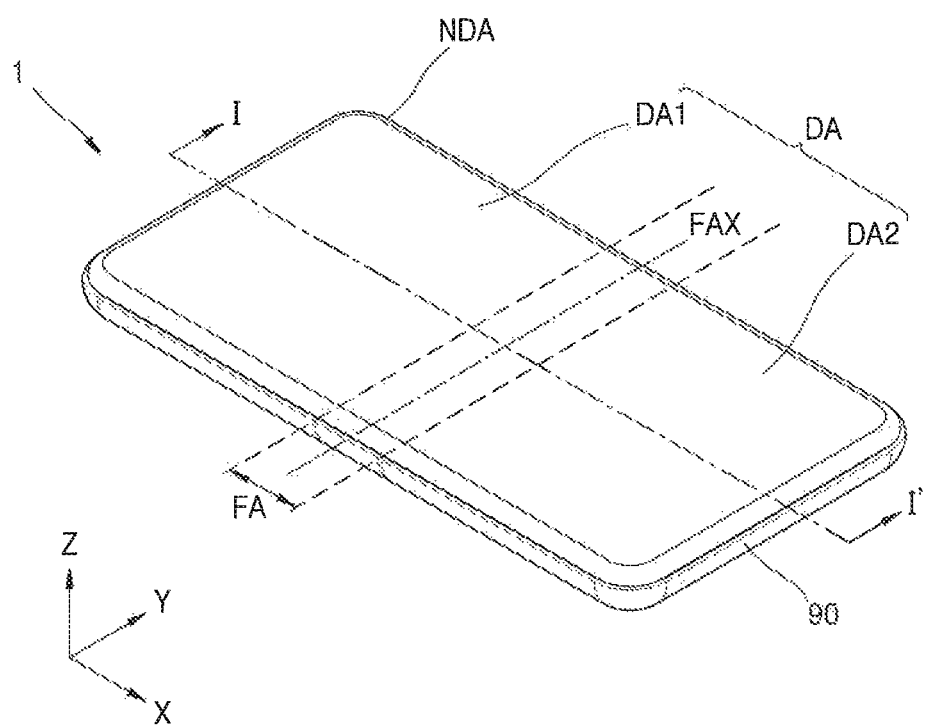
FIG. 1 is a schematic perspective view of a display apparatus according to an embodiment.

The present inventive concepts will now be described more fully hereinafter with reference to the accompanying drawings, in which embodiments of the inventive concepts are shown. The inventive concepts may, however, be embodied in different forms and should not necessarily be construed as limited to the embodiments set forth herein. Rather, these embodiments are provided so that this disclosure will be thorough and complete, and will fully convey the scope of the inventive concepts to those skilled in the art. Like reference numbers and symbols may refer to like elements, and to the extent that a description of an element has been omitted, it may be understood that the element is at least similar to corresponding elements that are described elsewhere in the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not necessarily limited to the following embodiments and may be embodied in various forms.

It will be understood that although the terms "first," "second," etc. may be used herein to describe various elements, these elements should not be limited by these terms. These terms are only used to distinguish one element from another.

In the following embodiments, description of the singular form of an element may apply to the plural forms of the same element unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it may be directly on the other layer, region, or element, or may be indirectly on the other layer, region, or element with intervening layers, regions, or elements therebetween.

Sizes of elements in the drawings may be exaggerated or contracted for convenience of explanation. In addition, because sizes and thicknesses of elements in the drawings are not illustrated to scale for convenience of explanation, the disclosure is not limited thereto.

In the present specification, an expression such as "A and/or B" indicates A, B, or A and B. Also, an expression such as "at least one of A and B" indicates A, B, or A and B.

In the following embodiments, the expression "a line extends in a first direction or a second direction" may apply to a case in which "a line extends in a linear shape" and a to case in which "a line extends in a zigzag or curved shape substantially in a first direction or a second direction."

In the following embodiments, when an element is referred to as being "on a plane," it is understood that an element is viewed from a top-down or bottom-up view, and when an element is referred to as being "on a cross-section," it is understood that the element is vertically cut and viewed from the side. In the following embodiments, when elements "overlap" each other, the elements may overlap "on a plane" or in "a cross-section" as determined by context and the referenced Figure(s) or stated explicitly.

Hereinafter, the embodiments of the disclosure will be described in detail with reference to the attached drawings.

Figure 2:
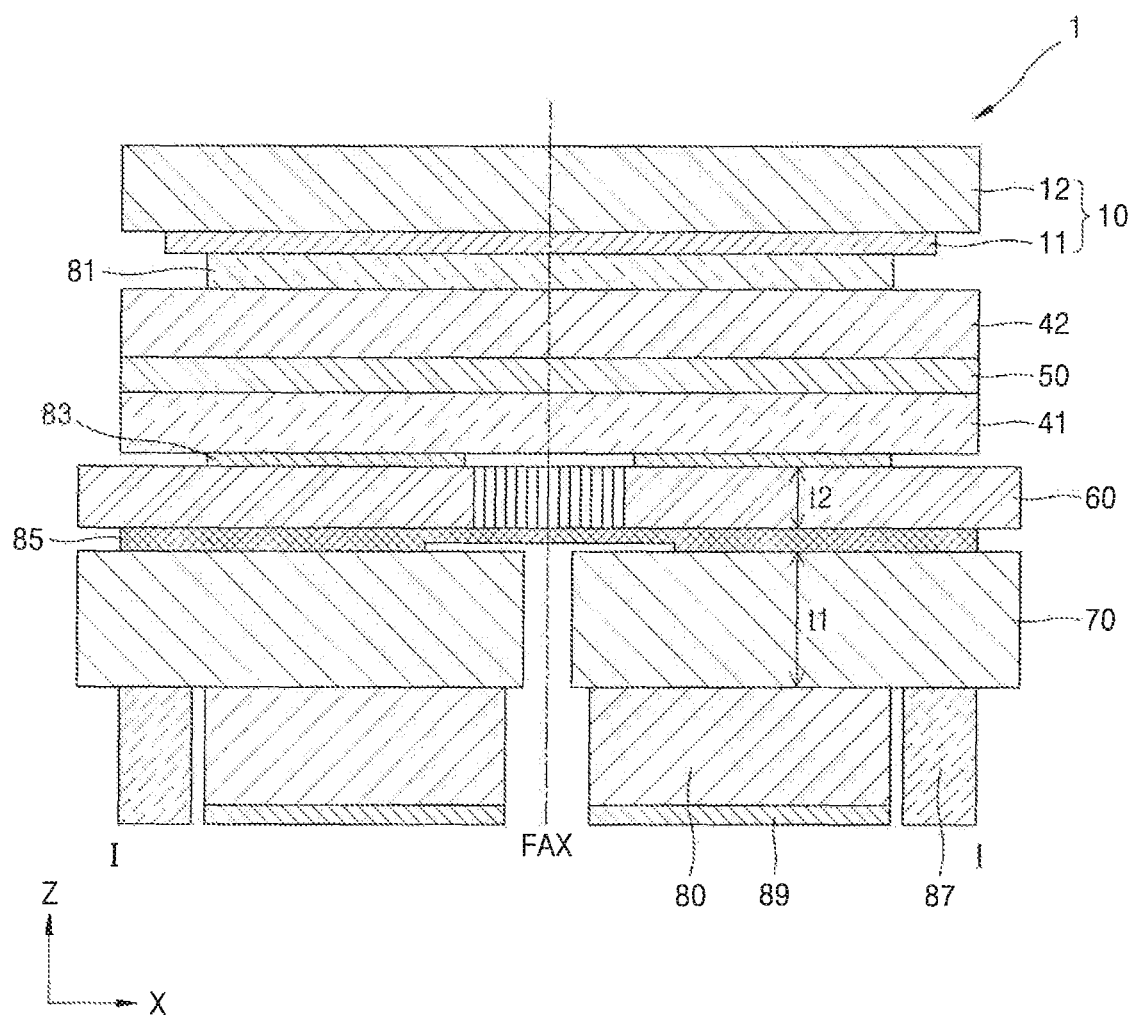
FIG. 2 is a schematic cross-sectional view of a display apparatus taken along line I-I' of FIG. 1.
Figure 3:
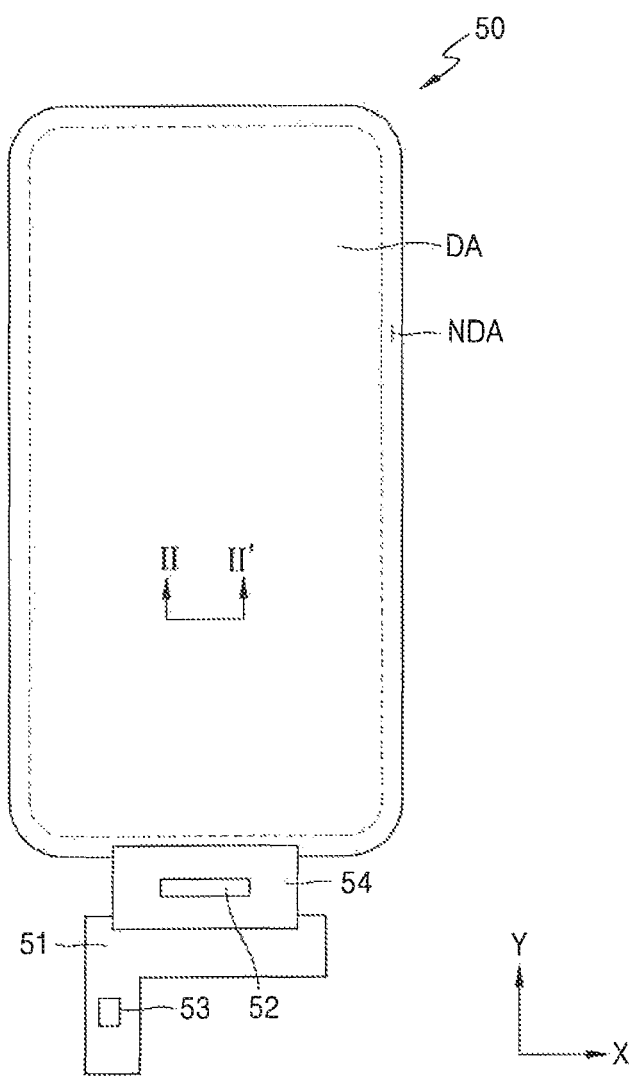
FIG. 3 is a schematic plan view of a display panel of a display apparatus, according to an embodiment.
Figure 4:
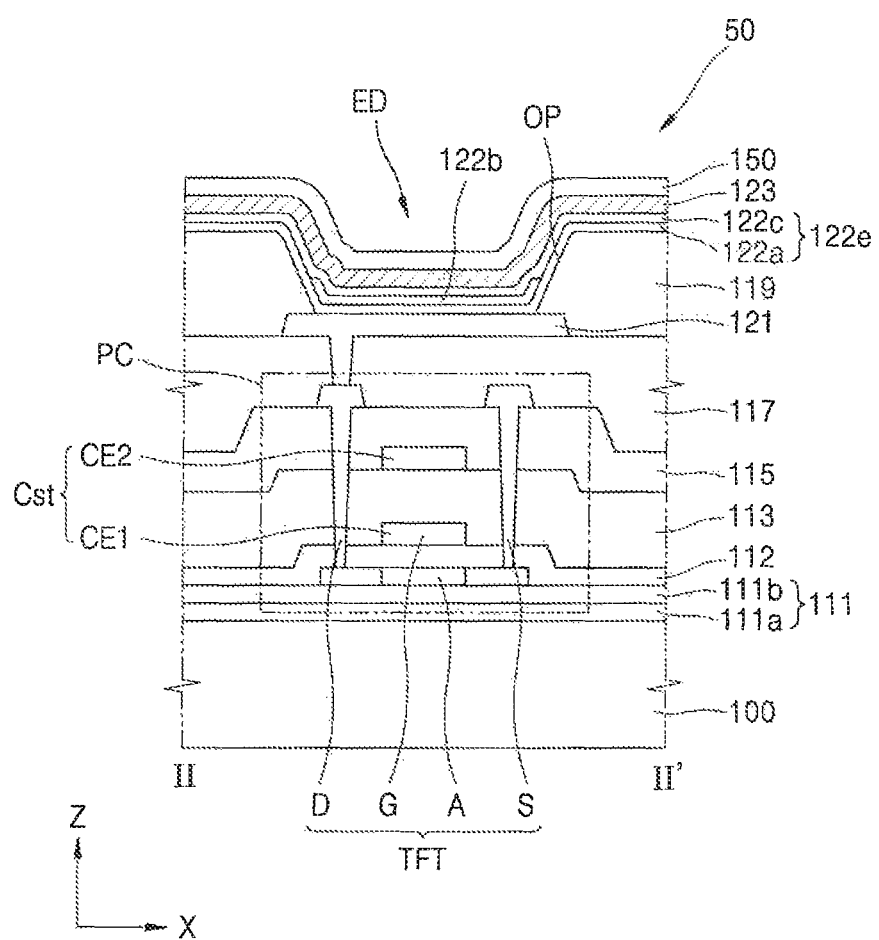
FIG. 4 is a schematic cross-sectional view of a display panel of a display apparatus taken along line II-II' of FIG. 3.

FIG. 1 is a schematic perspective view of a display apparatus 1 according to an embodiment, FIG. 2 is a schematic cross-sectional view of the display apparatus 1 according to an embodiment, FIG. 3 is a schematic plan view of a display panel 50 of a display apparatus, according to an embodiment, and FIG. 4 is a schematic cross-sectional view of the display panel 50 of the display apparatus, according to an embodiment. FIG. 2 corresponds to a cross-sectional view of the display apparatus taken along line I-I' of FIG. 1, and FIG. 4 corresponds to a cross-sectional view of the display panel taken along line II-II' of FIG. 3.

Referring to FIGS. 1 to 4, the display apparatus 1 is configured to display a moving image or a still image and may be used as a display screen for various products, including portable electronic devices, such as mobile phones, smartphones, tablet personal computers (PCs), mobile communication terminals, electronic notebooks, e-books, portable multimedia players (PMPs), navigations, and ultra-mobile PCs (UMPCs), as well as televisions (TVs), laptops, monitors, billboards, and Internet of things (IoT) devices. Also, the display apparatus 1 may be used in wearable devices including smartwatches, watchphones, glasses-type displays, and head-mounted displays (HMD). In addition, the display apparatus 1 may be used in instrument panels for automobiles, center fascias for automobiles, or center information displays (CID) arranged on a dashboard, room mirror displays that replace side-view mirrors of automobiles, and in displays arranged on the backside of front seats as an entertainment for back seats of automobiles.

The display apparatus 1 may include a display area DA and a non-display area NDA located around the display area DA. In an embodiment, the display apparatus 1 may include a folding area FA, and the display area DA may include a first display area DA1 and a second display area DA2 spaced apart from each other with the folding area FA located therebetween. For example, the first display area DA1 and the second display area DA2 may be spaced apart from each other in a first direction (e.g., an X direction) with the folding area FA located therebetween.

In an embodiment, the display area DA may refer to an area in which an image is displayed, and the non-display area NDA may refer to an area in which an image is not displayed. In an embodiment, the folding area FA may be an area in which an image is displayed. For example, display elements are arranged in the display area DA and the folding area FA so that an image may be displayed continuously across the display area DA and the folding FA by the display elements.

In an embodiment, the folding area FA may be an area that is folded about a folding axis FAX.

In an embodiment, the display apparatus 1 may include a cover member 10, a display panel 50, a plate 60, a digitizer 70, and a lower cover 90.

As used herein, "upper" refers to a direction in which the cover member 10 is arranged with respect to the display panel 50, e.g., a +Z direction, and "lower" refers to a direction in which the digitizer 70 is arranged with respect to the display panel 50, e.g., a −Z direction.

In an embodiment, the display apparatus 1 may have a rectangular shape on a plane. For example, the display apparatus 1 may have a substantially rectangular planar shape having a long side in a first direction (e.g., an X-direction) and a short side in a second direction (e.g., a Y-direction) that intersects the first direction (the X-direction), as shown in FIG. 1. A corner at which the long side in the first direction (the X-direction) meets the short side in the second direction (the Y-direction) may be rounded to have a certain curvature or may be formed at a right angle. However, the planar shape of the display apparatus 1 is not necessarily limited to a rectangle, but may be formed in another polygonal shape, an elliptical shape, or an irregular shape.

In an embodiment, the display apparatus 1 may have various shapes. For example, the shape of the display apparatus 1 may not change. In an embodiment, at least a portion of the display apparatus 1 may be folded. In this case, the display apparatus 1 may be set to an in-folding shape in which portions of the display area DA face each other when the display apparatus 1 is folded, or set to an out-folding shape in which portions of the display area DA face away from each other when the display apparatus 1 is folded. Hereinafter, for convenience of description, a case where the display apparatus 1 is in an in-folding shape will be mainly described.

In an embodiment, the display apparatus 1 may be folded about (or around) the folding axis FAX. In this case, when the display apparatus 1 is folded about (or around) the folding axis FAX, a size of the display apparatus 1 may decrease compared to when the display apparatus 1 is completely unfolded. Accordingly, when the display apparatus 1 is completely unfolded, a large display screen may be utilized, and when the display apparatus 1 is completely folded, the size of the display apparatus 1 decreases so that the portability of the display apparatus 1 may be increased.

In an embodiment, the cover member 10 may be arranged over the display panel 50. The cover member 10 may cover an upper portion of the display panel 50. Thus, the cover member 10 may serve to protect an upper surface of the display panel 50.

In an embodiment, the cover member 10 may include a transmissive cover portion corresponding to the display panel 50 and a light-shielding cover portion corresponding to an area other than the display panel 50. The light-shielding cover portion may include an opaque material that blocks light. The light-shielding cover portion may include a pattern that may be shown to a user when an image is not displayed.

In an embodiment, the cover member 10 may include a cover window 11 and a protective member 12. The cover window 11 may include a transparent material. For example, the cover window 11 may include glass, a synthetic resin formed of a transparent material, or the like. The cover window 11 may include at least one layer.

In an embodiment, the protective member 12 may be arranged on an upper surface of the cover window 11 to prevent or minimize scratches or the like on the cover window 11. In an embodiment, an opaque layer may be arranged on a portion of the protective member 12, such as an edge of the protective member 12. The opaque layer may block light.

The display panel 50 may be arranged under the cover member 10. In an embodiment, the display panel 50 of the display apparatus 1 may include the display area DA and the non-display area NDA. Accordingly, because the display elements are arranged in the display area DA of the display panel 50, an image may be displayed thereon. Because display elements are not arranged in the non-display area NDA, an image may not be displayed thereon.

In an embodiment, the display panel 50 may be a light-emitting display panel including an emitting diode. In an embodiment, the display panel 50 may be an organic light-emitting display panel including an organic light-emitting diode and an organic emission layer. In other embodiments, the display panel 50 may be a micro light-emitting diode (LED) display panel using a micro-LED, a quantum dot light-emitting display panel using a quantum dot light-emitting diode including a quantum dot emission layer, or an inorganic light-emitting display panel using an inorganic light-emitting element including inorganic semiconductor.

In an embodiment, the display panel 50 may include a rigid display panel that is rigid and is not easily bent, and/or a flexible display panel that is flexible and is easily bendable, foldable, or rollable. As used herein, "flexible", "bendable," "rollable" and the like may refer to elements that can be easily bended without causing damage to components therein. For example, the display panel 50 may include a foldable display panel that may be folded or unfolded, a curved display panel with a curved display surface, a bended display panel in which areas other than a display surface are configured to bend, a rollable display panel that may be rolled or unrolled, and/or a stretchable display panel that may be stretched.

The display panel 50 may include a transparent display panel such that an object or a background arranged on a lower surface of the display panel 50 may be viewed from the upper surface of the display panel 50. Alternatively, the display panel 50 may be reflective display panel that may reflect an object or a background on the upper surface of the display panel 50.

With reference to FIG. 3, a first flexible film 54 may be attached to an edge of one side of the display panel 50. For example, one side of the first flexible film 54 may be attached to the edge of the one side of the display panel 50 by using an anisotropic conductive film. The first flexible film 54 may include a flexible film that is bendable.

A display driver 52 may be arranged on the first flexible film 54. The display driver 52 may receive control signals and power voltages, and may generate and output signals and voltages to drive the display panel 50. The display driver 52 may include an integrated circuit (IC).

A display circuit board 51 may be attached to the other side of the first flexible film 54. For example, the other side of the first flexible film 54 may be attached to an upper surface of the display circuit board 51 by using an anisotropic conductive film. The display circuit board 51 may include a flexible printed circuit board (FPCB) that may be bent, a rigid printed circuit board (PCB) that is rigid and not easily bent, or a composite printed circuit board including both a rigid PCB and an FPCB.

A touch sensor driver 53 may be arranged on the display circuit board 51. The touch sensor driver 53 may include an IC. The touch sensor driver 53 may be attached onto the display circuit board 51. The touch sensor driver 53 may be electrically connected to touch electrodes of a touchscreen layer of the display panel 50 through the display circuit board 51.

The touchscreen layer of the display panel 50 may sense a touch input of the user by using at least one of various touch methods such as a resistive film method, a capacitive method (including mutual capacitance and self-capacitance methods), or the like. For example, when the display panel 50 senses a touch input using a capacitive method, the display panel 50 may contain a touchscreen layer with touch electrodes, where the touch electrodes include driving electrodes and sensing electrodes. In an example operation, when the touchscreen layer of the display panel 50 senses the user's touch input in the capacitive method, the touch sensor driver 53 may apply driving signals to driving electrodes, and sense voltages that are charged in mutual capacitance between the driving electrodes and sensing electrodes through the sensing electrodes, and thus, may determine whether the user touched the touchscreen layer and where the touch occurred. The user's touch may include a contact touch and a proximity touch. The contact touch indicates that an object such as the user's finger, a pen, or the like directly contacts the cover member 10 arranged on the touchscreen layer. The proximity touch indicates that an object such as the user's finger, a pen, or the like is located close to, but apart from, the cover member 10, for example, in a hovering manner. The touch sensor driver 53 may transmit sensor data to a main processor according to the sensed voltages, and the main processor may calculate touch coordinates at which a touch input has occurred by analyzing the sensor data.

A power supply portion for supplying driving voltages to drive subpixels, a scan driver, and the display driver 52 of the display panel 50 may be additionally arranged on the display circuit board 51. Alternatively, the power supply portion may be integrated with the display driver 52. In this case, the display driver 52 and the power supply portion may be formed as one integrated circuit.

As described above, the display panel 50 may include the display area DA and the non-display area NDA. The display panel 50 may include a substrate 100, a thin-film transistor TFT, and a display element, which are stacked sequentially. In this case, the display element may include an organic light-emitting diode (OLED) but is not necessarily limited thereto.

The substrate 100 may include an insulating material such as glass, quartz, a polymer resin, or the like. The substrate 100 may include a rigid substrate or a flexible substrate that is bendable, foldable, or rollable.

In an embodiment, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including a layer including the previously described polymer resin and an inorganic layer. For example, the substrate 100 may include two layers including the previously described polymer resin and an inorganic barrier layer.

A buffer layer 111 may be located over the substrate 100 to reduce or block the penetration of foreign materials, moisture, or external air from entering the substrate 100 and may provide a flat surface on the substrate 100. The buffer layer 111 may include an inorganic material such as oxide or nitride, an organic material, and/or an organic/inorganic composite material. The buffer layer 111 may include a single-layered or multi-layered structure of an inorganic material and an organic material. A barrier layer for blocking the penetration of external air may be further included between the substrate 100 and the buffer layer 111. In an embodiment, the buffer layer 111 may include silicon oxide ($SiO_2$) or silicon nitride ($SiN_x$). The buffer layer 111 may be implemented such that a first buffer layer 111a and a second buffer layer 111b are stacked.

A pixel circuit PC including a thin-film transistor TFT and a storage capacitor Cst may be arranged on the buffer layer 111. In an embodiment, the thin-film transistor TFT may include a semiconductor layer A, a gate electrode G, a source electrode S, and a drain electrode D, and the storage capacitor Cst may include a lower electrode CE1 and an upper electrode CE2.

The semiconductor layer A may be arranged on the buffer layer 111. The semiconductor layer A may include polysilicon. Alternatively, in an embodiment, the semiconductor layer A may include amorphous silicon. The semiconductor layer A may include an oxide of at least one of the following elements: indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A may include a channel region, and a source region and a drain region that are doped with dopants.

A first gate insulating layer 112 may be arranged on the semiconductor layer A. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or multiple layers of the previously described inorganic insulating material.

The gate electrode G may be arranged on the first gate insulating layer 112. In an embodiment, the gate electrode G may at least partially overlap the semiconductor layer A arranged under the gate electrode G in a thickness direction of the substrate 100 (e.g., a Z direction). In an embodiment, the gate electrode G may include molybdenum (Mo), aluminum (Al), copper (Cu), Titanium (Ti), or the like, and may include a single layer or multiple layers. For example, the gate electrode G may include a single layer of Mo.

A second gate insulating layer 113 may be arranged on the gate electrode G. The second gate insulating layer 113 may include an inorganic insulating material such as $SiO_2$, $SiN_x$, SiON, $Al_2O_3$, $TiO_2$, $Ta_2O_5$, $HfO_2$, or ZnO. The second gate insulating layer 113 may include a single layer or multiple layers of the previously described inorganic insulating material.

The upper electrode CE2 of the storage capacitor Cst may be arranged on the second gate insulating layer 113. In an embodiment, the upper electrode CE2 may at least partially overlap the gate electrode G arranged under the upper electrode CE2. In an embodiment, the gate electrode G and the upper electrode CE2 which overlap each other with the second gate insulating layer 113 disposed therebetween may constitute the storage capacitor Cst. For example, the gate electrode G may be the lower electrode CE1 of the storage capacitor Cst.

The upper electrode CE2 may include a single layer or multiple layers including Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu.

An interlayer insulating layer 115 may be arranged on the upper electrode CE2. The interlayer insulating layer 115 may include an inorganic insulating material such as $SiO_2$, $SiN_x$, SiON, $Al_2O_3$, $TiO_2$, $Ta_2O$, $Hfn_2$, or ZnO. The interlayer insulating layer 115 may include a single layer or multiple layers of the previously described inorganic insulating material.

The source electrode S and/or the drain electrode D may be arranged on the interlayer insulating layer 115. The source electrode S and/or the drain electrode D may include a conductive material including Mo, Al, Cu, and Ti and may include a single layer or multiple layers of the previously described material. In an embodiment, the source electrode S and the drain electrode D may have a multi-layered structure of Ti/Al/Ti.

A planarization layer 117 may be arranged on the source electrode S and/or the drain electrode D. The planarization layer 117 may have a flat upper surface so that a pixel electrode 121 arranged on the planarization layer 117 may be substantially flat.

The planarization layer 117 may include an organic material and/or an inorganic material and may have a single-layered structure or a multi-layered structure. The planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. The planarization layer 117 may additionally or alternatively include an inorganic insulating material such as $SiO_2$, $SiN_x$, SiON, $Al_2O_3$, $TiO_2$, $Ta_2O$, $HfO_2$, or ZnO. After the planarization layer 117 is formed, chemical mechanical polishing may be performed on the upper surface thereof to provide the flat upper surface.

The planarization layer 117 may include a via hole that exposes the source electrode S and/or the drain electrode D of the thin-film transistor TFT, and the pixel electrode 121 may be electrically connected to the thin-film transistor TFT by contact with the source electrode S and/or the drain electrode D through the via hole.

Figure 5:
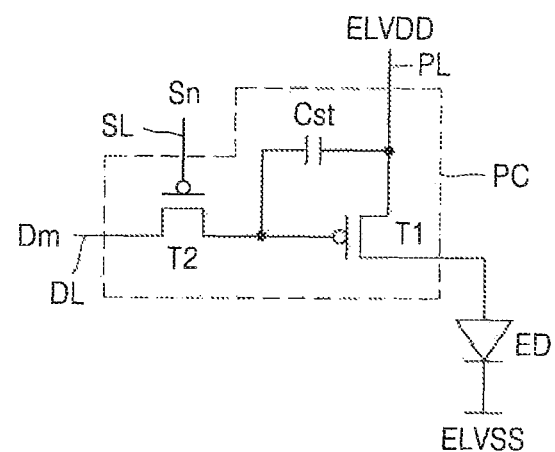
FIGS. 5 and 6 are circuit diagrams of a pixel circuit configured to drive a display apparatus, according to an embodiment.
Figure 6:
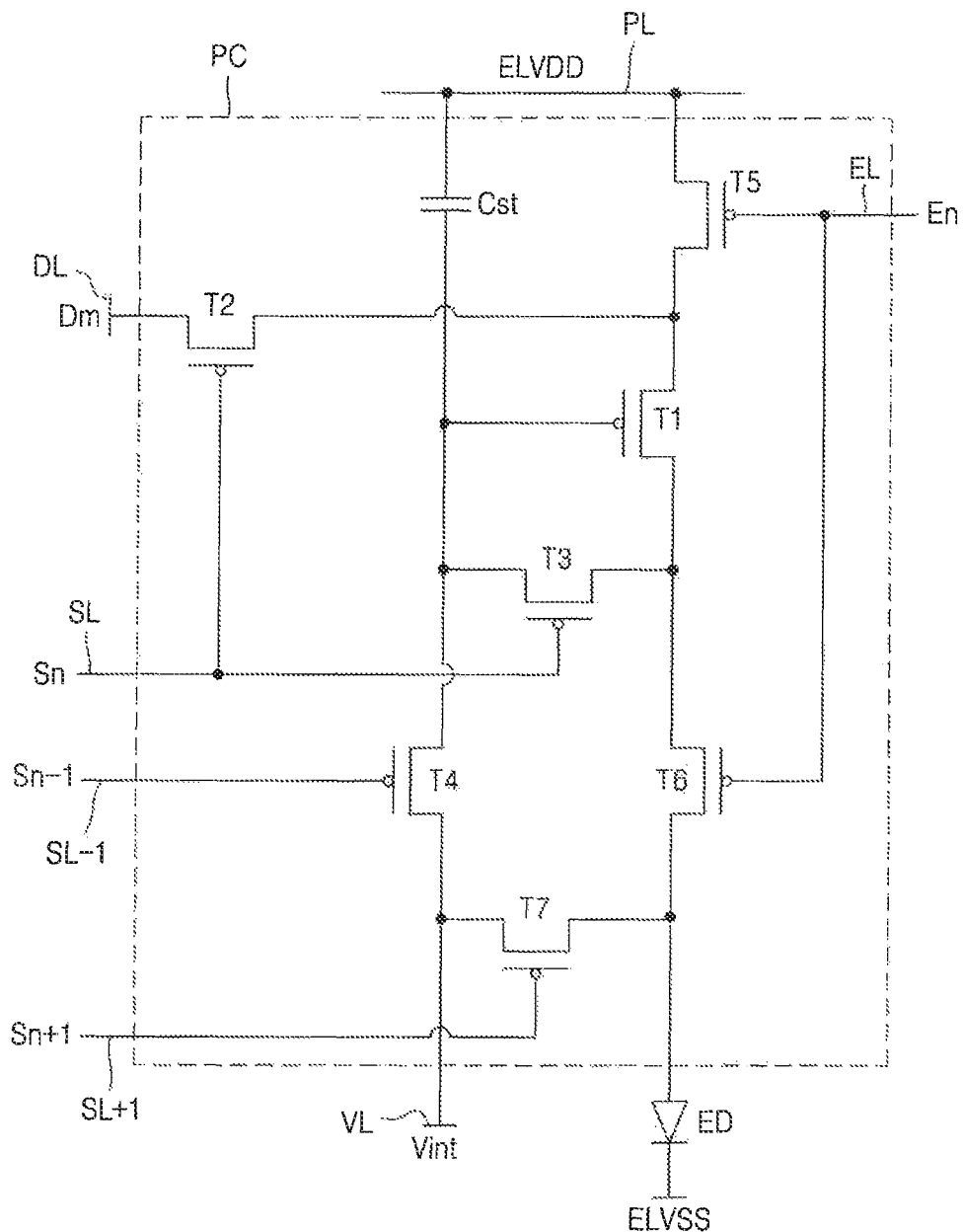

FIGS. 5 and 6 are circuit diagrams of a pixel circuit PC configured to drive the display apparatus, according to an embodiment. The circuits represented in FIGS. 5 and 6, though implemented differently, may provide substantially the same functionality.

Referring to FIG. 5, the pixel circuit PC may be connected to an emission device ED to implement emission of subpixels. In an embodiment, the pixel circuit PC may include a driving thin-film transistor T1, a switching thin-film transistor T2, and a storage capacitor Cst. The switching thin-film transistor T2 may be connected to a scan line SL and a data line DL and may be configured to transmit a data signal Dm, which is input through the data line DL, to the driving thin-film transistor T1 in response to a scan signal Sn input through the scan line SL.

The storage capacitor Cst may be connected to the switching thin-film transistor T2 and a driving voltage line PL, and may be configured to store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may be configured to control a driving current flowing from the driving voltage line PL to the emission device ED in response to a voltage value stored in the storage capacitor Cst. The emission device ED may emit light having a luminance according to the driving current.

Although FIG. 5 illustrates that the pixel circuit PC includes two thin-film transistors and one storage capacitor, the present disclosure is not necessarily limited thereto.

Referring to FIG. 6, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 6 illustrates that each pixel circuit PC includes signal lines SL, SL−1, SL+1, EL, and DL, an initialization voltage line VL, and a driving voltage line PL, the present disclosure is not necessarily limited thereto. In an embodiment, one or more of the signal lines SL, SL−1, SL+1, EL, and DL and/or the initialization voltage line VL may be shared by neighboring pixel circuits.

A drain electrode of the driving thin-film transistor T1 may be electrically connected to the emission device ED by the emission control thin-film transistor T6. The driving thin-film transistor T1 may be configured to receive a data signal Dm corresponding to a switching operation of the switching thin-film transistor T2 and supply the driving current to the emission device ED.

A gate electrode of the switching thin-film transistor T2 may be connected to the scan line SL, and a source electrode of the thin-film transistor T2 may be connected to the data line DL. A drain electrode of the switching thin-film transistor T2 may be connected to a source electrode of the driving thin-film transistor T1 and the driving voltage line PL by the operation control thin-film transistor T5.

The switching thin-film transistor T2 may be turned on in response to the scan signal Sn received through the scan line SL, and may be configured to perform a switching operation that includes transmitting the data signal Dm, which is transmitted through the data line DL, to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1, and may be connected to a pixel electrode of the emission device ED by the emission control thin-film transistor T6. A drain electrode of the compensation thin-film transistor T3 may be connected to any one of electrodes of the storage capacitor Cst, a source electrode of the first initialization thin-film transistor T4, and a gate electrode of the driving thin-film transistor T1. The compensation thin-film transistor T3 may be turned on in response to the scan signal Sn received through the scan line SL and may connect the gate electrode and the drain electrode of the driving thin-film transistor T1 to each other so that the driving thin-film transistor T1 is diode-connected.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to any one of the electrodes of the storage capacitor Cst, a drain electrode of the compensation thin-film transistor T3, and/or the gate electrode of the driving thin-film transistor T1. The first initialization thin-film transistor T4 may be turned on in response to a previous scan signal Sn−1 received through the previous scan line SL−1 and may be configured to perform an initialization operation that includes initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the driving voltage line PL, while drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the emission device ED. In an embodiment, the operation control thin-film transistor T5 and the emission control thin-film transistor T6 are simultaneously turned on in response to an emission control signal En received through the emission control line EL, the driving voltage ELVDD is transmitted to the emission device ED, and the driving current flows through the emission device ED.

A gate electrode of the second initialization thin-film transistor T7 may be connected to a next scan line SL+1. A source electrode of the second initialization thin-film transistor T7 may be connected to the pixel electrode of the emission device ED. A drain electrode of the second initialization thin-film transistor T7 may be connected to the initialization voltage line VL. The second initialization thin-film transistor T7 may be turned on in response to a next scan signal Sn+1 received through the next scan line SL+1 and may be configured to initialize the pixel electrode of the emission device ED.

Although FIG. 6 illustrates an example in which the first initialization thin-film transistor T4 and the second initialization thin-film transistor T7 are connected to the previous scan line SL−1 and the next scan line SL+1, respectively, one or more embodiments of the present disclosure are not necessarily limited thereto. In an embodiment, the first initialization thin-film transistor T4 and the second initialization thin-film transistor T7 may both be connected to the previous scan line SL−1 and driven according to the previous scan signal Sn−1.

One electrode of the storage capacitor Cst may be connected to the driving voltage line PL. Any one of the electrodes of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode) of the emission device ED receives a common voltage ELVSS. The emission device ED may receive the driving current from the driving thin-film transistor T1 and emit light in response.

The pixel circuit PC is not necessarily limited to the number and circuit design of the thin-film transistors and the storage capacitor described with reference to FIGS. 5 and 6, and the number and circuit design of the thin-film transistors and the storage capacitor may be variously changed according to various functions of a pixel in display devices according to embodiments of the present disclosure.

Referring to FIG. 4, in an embodiment, display elements including emission devices ED may be arranged over the planarization layer 117. In one embodiment, the emission devices ED may each be an OLED. The OLED may include a pixel electrode 121, an emission layer 122*b*, and an opposite electrode 123.

The pixel electrode 121 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 121 may include a reflective layer including Ag, Mg, Al, Pt, Pd, Au, Ni, Nd, Ir, Cr, or a compound thereof. For example, the pixel electrode 121 may have a structure which includes layers including ITO, IZO, ZnO, or $In_2O_3$ over and/or under the reflective layer. In this case, the pixel electrode 121 may have a stack structure of ITO/Ag/ITO.

A pixel-defining layer 119 may include an opening OP that covers an edge of the pixel electrode 121 on the planarization layer 117 and exposes at least a portion of the pixel electrode 121. For example, the pixel defining layer 119 may cover a peripheral region (e.g., the edges and lateral sides) of the pixel electrode 121. A size and shape of an emission area, that is, a subpixel, of the OLED may be defined by the opening OP.

The pixel-defining layer 119 may prevent the occurrence of an electrical arc at the edge of the pixel electrode 121 by increasing a distance between the edge of the pixel electrode 121 and the opposite electrode 123 arranged over the pixel electrode 121. The pixel-defining layer 119 may be formed through spin coating or the like by using an organic insulating material such as polyimide, polyamide, an acrylic resin, BCB, HMDSO, and/or a phenol resin.

The emission layer 122*b* which is formed to correspond to the pixel electrode 121 may be arranged inside the opening OP of the pixel-defining layer 119. The emission layer 122*b* may include a polymer material and/or a low molecular weight material and may emit red light, green light, blue light, or white light. For example, the emission layer 122*b* may include a light filter therein to allow only light within a certain range of wavelengths to pass through. However, this is merely one embodiment, and the present disclosure provides for display apparatuses without filters or with filters disposed layers other than the emission layer 122*b*, as will be described later.

An organic functional layer 122*e* may be disposed over and/or under the emission layer 122*b*. The organic functional layer 122*e* may include a first functional layer 122*a* and/or a second functional layer 122*c*. In some embodiments, the first functional layer 122*a* or the second functional layer 122*c* may be omitted.

In an embodiment, the first functional layer 122*a* is be arranged under the emission layer 122*b*. The first functional layer 122*a* may include a single layer or multiple layers which include an organic material. The first functional layer 122a may include a hole transport layer (HTL) having a single-layered structure. Alternatively, the first functional layer 122a may include a hole injection layer (HIL) and an HTL. The first functional layer 122a may be formed as one body to correspond to OLEDs included in the display area DA. For example, the first functional layer 122a may be formed in a continuous body that covers more than one OLED (for example, all the OLEDs) included in the display area DA.

The second functional layer 122c may be arranged on the emission layer 122b. The second functional layer 122c may include a single layer or multiple layers including an organic material. The second functional layer 122c may include an electron transport layer (ETL) and/or an electron injection layer (EIL). The second functional layer 122c may be formed as one body to correspond to the OLEDs included in the display area DA similar to the first functional layer 122a.

The opposite electrode 123 may be arranged on the second functional layer 122c. The opposite electrode 123 may include a conductive material having a low work function. For example, the opposite electrode 123 may include a (semi-)transparent layer including Ag, Mg, Al, Pt, Pd, Au, Ni, Nd, Ir, Cr, Li, Ca, or any alloy thereof. The opposite electrode 123 may further include a layer such as ITO, IZO, ZnO, or $In_2O_3$ on the (semi-)transparent layer including the previously described material. The opposite electrode 123 may be formed as one body to correspond to the OLEDs included in the display area DA.

An upper layer 150 may be formed on the opposite electrode 123. In an embodiment, the upper layer 150 may include an organic material and/or an inorganic material. The upper layer 150 may protect the opposite electrode 123 and increase light extraction efficiency. The upper layer 150 may include an organic material having a refractive index higher than that of the opposite electrode 123. The upper layer 150 may include a stack of layers having different refractive indexes. For example, the upper layer 150 may include a stack of (a high refractive index layer)/(a low refractive index layer)/(a high refractive index layer). In this case, a refractive index of the high refractive index layer may be about 1.7 or more, and a refractive index of the low refractive index layer may be about 1.3 or less.

The upper layer 150 may further include lithium fluoride (LiF). Additionally or alternatively, the upper layer 150 may further include an inorganic insulating material such as $SiO_2$ or $SiN_X$. In some embodiments, the upper layer 150 may be omitted. However, hereinafter, for convenience of description, a case where the upper layer 150 is arranged on the opposite electrode 123 will be mainly described in detail.

In some embodiments, the display panel 50 as described above may further include an encapsulation member that shields the upper layer 150. In these embodiments, the encapsulation member may include an encapsulation substrate arranged to face the substrate 100, and a sealing member arranged between the substrate 100 and the encapsulation substrate to block a space between the substrate 100 and the encapsulation substrate.

In an embodiment, the encapsulation member described above may include a thin-film encapsulation layer. The thin-film encapsulation layer may be arranged on the upper layer 150 to be in direct contact with the upper layer 150. In this case, the thin-film encapsulation layer may cover portions of the display area DA and the non-display area NDA to prevent penetration of external moisture and oxygen. The thin-film encapsulation layer may include at least one organic layer and at least one inorganic layer. Hereinafter, for convenience of description, a case where the thin-film encapsulation layer includes a first inorganic layer, an organic layer, and a second inorganic layer, which are sequentially arranged on an upper surface of the upper layer 150, will be mainly described in detail.

The first inorganic layer covers the opposite electrode 123 and may include silicon oxide, silicon nitride, and/or silicon oxynitride. Because the first inorganic layer is formed atop a structure that may not be flat, an upper surface of the first inorganic layer may not be flat. The organic layer covers the first inorganic layer and may have a substantially flat upper surface unlike the first inorganic layer. For example, the organic layer may have a flat upper surface in a portion corresponding to the display area DA. The organic layer may include one or more of polyethylene terephthalate, polyethylene naphthalate, polycarbonate, polyimide, polyethylene sulfonate, polyoxymethylene, polyarylate, and hexamethyldisiloxane. The second inorganic layer covers the organic layer and may include silicon oxide, silicon nitride, and/or silicon oxynitride.

In an embodiment, the display panel 50 may include a touchscreen layer. The touchscreen layer may include touch electrodes configured to sense the presence of a user's touch. The touchscreen layer may be arranged over the encapsulation member as described above.

In an embodiment, and with reference to FIG. 2, an optical functional layer 42 may be arranged on the display panel 50, and a panel protection member 41 may be arranged under the display panel 50.

The optical functional layer 42 may be arranged over the touchscreen layer. The optical functional layer 42 may include an anti-reflective layer. The anti-reflective layer may reduce a reflectance of light (external light) incident from the outside onto the display apparatus 1.

In some embodiments, the anti-reflective layer may include a polarizing film. The polarizing film may include a linear polarizing plate and a retardation film such as a quarter-wave plate. The retardation film may be arranged over the touchscreen layer, and the linear polarizing plate may be arranged over the retardation film.

In an embodiment, the anti-reflective layer may include a filter layer which includes a block matrix and color filters. The color filters may be arranged in consideration of the colors of light emitted from each of subpixels of the display apparatus 1. For example, the filter layer may include red, green, and/or blue filters.

In an embodiment, the anti-reflective layer may include a destructive interference structure. The destructive interference structure may include a first reflective layer and a second reflective layer, which are disposed on different layers from each other. First reflected light and second reflected light respectively reflected by the first reflective layer and the second reflective layer may destructively interfere with each other, and thus a reflectance of external light may decrease.

The cover member 10 may be arranged over the optical functional layer 42. The cover member 10 may be attached onto the optical functional layer 42 by a first adhesive member 81. In an embodiment, the first adhesive member 81 may include a transparent adhesive member such as a pressure sensitive adhesive (PSA) or an optically clear adhesive (OCA) film.

The panel protection member 41 may be arranged under the display panel 50. The panel protection member 41 may be attached to a lower portion of the display panel 50 through a PSA. However, one or more embodiments are not necessarily limited thereto.

In an embodiment, the digitizer 70 may be arranged under the display panel 50. The digitizer 70 includes a pattern layer, and accordingly the digitizer 70 may sense a signal input by an external electronic pen or the like. In particular, the digitizer 70 may sense a strength, direction, and/or other properties of the signal input from the external electronic pen or the like. The digitizer 70 may be electrically connected to a separate main circuit board. However, one or more embodiments are not necessarily limited thereto.

The digitizer 70 according to an embodiment may have a thickness of about 200 μm to about 350 μm (e.g., a first thickness t1). When the thickness of the digitizer 70 is less than 200 μm, the stiffness of the digitizer 70 may decrease, and the surface quality of a surface of the digitizer 70 may deteriorate. For example, in one embodiment, a curved surface is formed on the surface of the digitizer 70 by pattern layers 72a and 72b (see FIG. 9) when the digitizer 70 is too thin (e.g., less than 200 μm), and accordingly the flatness of the surface of the digitizer 70 may deteriorate. In this case, because an image generated by the display panel 50 is visually recognized as distorted due to the influence of the curved surface of the surface of the digitizer 70, the display quality may be decreased. However, when the thickness of the digitizer 70 is greater than 350 μm, the thickness of the digitizer 70 may be too great such that the folding characteristics of the display apparatus 1 including the digitizer 70 are decreased. For example, a radius of curvature of the display apparatus 1 may increase. Accordingly, when the digitizer 70 has the thickness of about 200 μm to about 350 μm (e.g., the first thickness t1), the stiffness of the digitizer 70 may be increased, and accordingly the surface quality of the surface of the digitizer 70 may be increased, and the folding characteristics of the display apparatus 1 may also increased. This will be described in more detail with reference to FIGS. 9 and 11.

In an embodiment, the plate 60 may be disposed between the display panel 50 and the digitizer 70. In an embodiment, the plate 60 may be arranged under the display panel 50 and support the display panel 50.

In an embodiment, the plate 60 may have a thickness of about 50 μm to about 80 μm (e.g., a second thickness t2). When the thickness of the plate 60 is less than 50 μm, the stiffness of the plate 60 may decrease. By contrast, when the thickness of the plate 60 is greater than 80 μm, the folding characteristics of the display apparatus 1 including the plate 60 may deteriorate similarly as described above with reference to the digitizer 70. Accordingly, when the plate 60 has the thickness of about 50 μm to about 80 μm (e.g., the second thickness t2), the stiffness of the plate 60 may be increased, and the folding characteristics of the display apparatus 1 may be increased. This will be described in more detail with reference to FIGS. 9 and 11.

Figure 7:
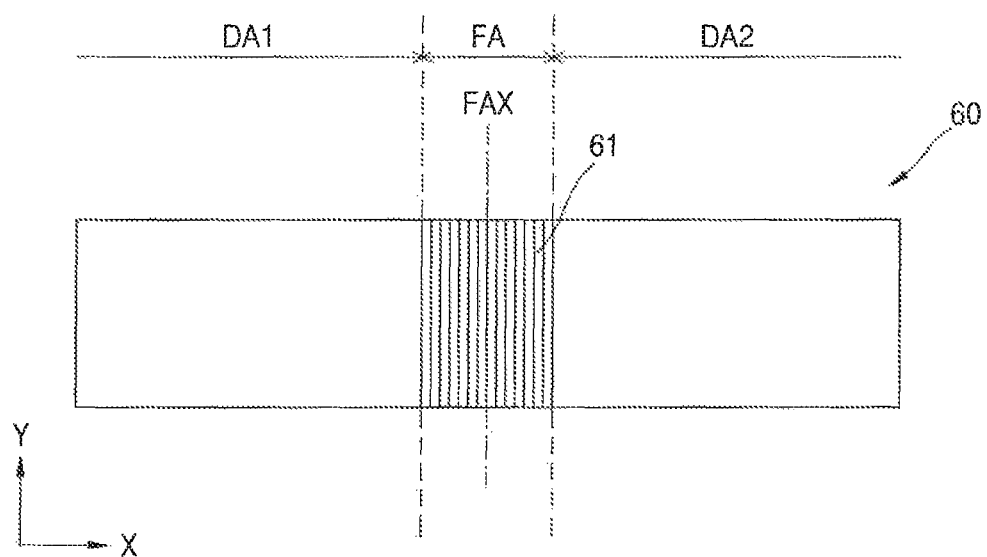
FIG. 7 is a schematic plan view of a plate of a display apparatus, according to an embodiment.

FIG. 7 is a schematic plan view of the plate 60 of the display apparatus, according to an embodiment.

Referring to FIGS. 2 and 7, in an embodiment, the plate 60 may have various structures according to whether the display apparatus 1 is folded and a folded shape of the display apparatus 1. For example, when the display apparatus 1 is not folded, the plate 60 may have a shape that does not change.

In an embodiment, the plate 60 may include a folding structure 61. When the display apparatus 1 is folded, the folding structure 61 may have a variable shape and/or a variable length. The folding structure 61 may include a pattern portion in which an opening is formed, or may include an uneven shape, or may include one or more links that are rotatably connected to each other. However, one or more embodiments are not necessarily limited thereto.

In an embodiment, when the display apparatus 1 is folded, the folding structure 61 may be folded about (or around) the folding axis FAX. The folding structure 61 may be provided so that both sides thereof are symmetrical about (or around) the folding axis FAX. In an embodiment, the plate 60 excluding the folding structure 61 may have a flat upper surface.

In an embodiment, the plate 60 may include at least one of glass, plastic, and a metal. For example, in some embodiments, the plate 60 may include glass and plastic, may include glass and a metal, may include plastic and a metal, or may include all of glass, plastic, and a metal. The folding structure 61 may include at least one of glass, plastic, and a metal.

In an embodiment, the folding structure 61 of the plate 60 may include a metallic material, and other portions of the plate 60 excluding the folding structure 61 may include a non-metallic material. However, one or more embodiments are not necessarily limited thereto.

Referring to FIG. 2, the plate 60 may be attached to the panel protection member 41 through a second adhesive member 83. For example, the plate 60 may be attached by the second adhesive member 83 in areas of the plate 60 other than the folding structure 61. The second adhesive member 83 may include a transparent adhesive member such as a PSA or an OCA film.

In an embodiment, the plate 60 and the digitizer 70 may be attached by a third adhesive member 85. In an embodiment, the third adhesive member 85 may include a PSA, an OCA film, or thermoplastic polyurethane (TPU).

In an embodiment, the third adhesive member 85 may be located under the plate 60 to prevent or minimize introduction of foreign materials into the folding structure 61 of the plate 60.

A cushion layer 80 may be arranged under the digitizer 70. In an embodiment, the cushion layer 80 may prevent or minimize damage to the digitizer 70 arranged on the cushion layer 80 due to external impact.

An insulating film 89 may be arranged under the cushion layer 80. Because the cushion layer 80 includes a sticky material, in some cases without the insulating film 89, the cushion layer 80 may attach to another member and prevent the display apparatus 1 from being folded. Accordingly, the insulating film 89 is attached to a lower portion of the cushion layer 80 and may prevent or minimize attachment of the cushion layer 80 to another member, so that the display apparatus 1 may be more easily folded.

In an embodiment, a fourth adhesive member 87 may be arranged under the digitizer 70. The fourth adhesive member 87 may include a PSA or an OCA film. However, one or more embodiments are not necessarily limited thereto. In one embodiment, the digitizer 70 may be connected to a separate main board circuit through the fourth adhesive member 87.

The previously mentioned main circuit board may include a main processor, a camera apparatus, a main connector, and components. The main processor may include an integrated circuit. The camera apparatus may be arranged on both upper and lower surfaces of the main circuit board, and each of the main processor and the main connector may be arranged on one of the upper and lower surfaces of the main circuit board.

The main processor may control functions of the display apparatus 1. For example, the main processor may output digital video data to a display driver through a display circuit board so that the display panel 50 displays an image. Also, the main processor may receive sensing data input from a touch sensor driver. The main processor may determine the presence of a user's touch according to the sensing data, and may execute an operation corresponding a direct touch or proximity touch of the user. For example, the main processor may analyze the sensing data to calculate touch coordinates of the user, and then may execute an application indicated by an icon touched by the user or perform an operation otherwise in accordance with the touch of the user. The main processor may include an application processor, a central processing unit, or a system chip including an integrated circuit.

The camera apparatus may process an image frame such as a still image or moving image obtained by an image sensor in a camera mode and output the image frame to the main processor. The camera apparatus may include one or more of a camera sensor (e.g., a charge-coupled device (CCD), a complementary metal-oxide semiconductor (CMOS), etc.), a photo sensor (or image sensor), and a laser sensor. The camera apparatus may be connected to an image sensor among other components that overlap a component area to process an image input to the image sensor.

A cable passing through a cable hole of a bracket may be connected to the main connector, and thus the main circuit board may be electrically connected to the display circuit board.

The main circuit board may further include at least one wireless communicator (e.g., a wireless transceiver), at least one input portion, at least one sensor portion, at least one output portion, at least one interface portion, a memory, and a power supply portion, in addition to the main processor, the camera apparatus, and the main connector.

The wireless communicator may include one or more of a broadcast reception module, a mobile communication module, a wireless Internet module, a short-range communication module, and/or a location information module.

The broadcast reception module may receive a broadcast signal and/or broadcast-related information from an external broadcast management server through a broadcast channel. The broadcast channel may include a satellite channel and a terrestrial channel.

The mobile communication module may transmit and receive a wireless signal to and from one or more of a base station, an external terminal, and/or a server in a mobile communication network constructed according to communication standards or communication schemes for mobile communication (e.g., global system for mobile communication (GSM), code-division multiple access (CDMA), code-division multiple access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), LTE-advanced (LTE-A), etc.). The wireless signal may include various types of data according to transmission and reception of a voice call signal, a video call signal, or a text/multimedia message.

The wireless Internet module may refer to a module for wireless Internet access. The wireless Internet module may be configured to transmit and receive a wireless signal in a communication network according to wireless Internet technologies. Examples of the wireless Internet technologies include wireless local area network (WLAN), wireless fidelity (Wi-Fi), Wi-Fi Direct, digital living network alliance (DLNA), and the like.

The short-range communication module may be used for short-range communication and may support short-range communication by using one or more of Bluetooth™, radio frequency identification (RFID), infrared data association (IrDA), ultra-wideband (UWB), ZigBee, near-field communication (NFC), Wi-Fi, Wi-Fi Direct, and wireless universal serial bus (USB) technologies. The short-range communication module may support wireless communication between the display apparatus 1 and a wireless communication system, between the display apparatus 1 and another electronic apparatus, and/or between the display apparatus 1 and a network in which another electronic apparatus (or an external server) is located, for example, through WLANs. The WLANs may include wireless personal area networks. In some cases, the other electronic apparatus may include a wearable apparatus capable of exchanging data with the display apparatus 1.

The location information module may be used for obtaining a location (or current location) of the display apparatus 1, and may include a global positioning system (GPS) module or a Wi-Fi module. For example, when the display apparatus 1 uses the GPS module, the location of the display apparatus 1 may be obtained by using a signal transmitted from a GPS satellite. Also, when the display apparatus 1 uses the Wi-Fi module, the location of the display apparatus 1 may be obtained based on information of a wireless access point (AP) that transmits or receives a wireless signal to or from the Wi-Fi module. The location information module may be used to obtain the location (or current location) of the display apparatus 1 and is not necessarily limited to a module that directly calculates or obtains the location of the display apparatus 1.

The input portion may include an image input portion such as the camera apparatus for inputting an image signal, an audio input portion such as a microphone for inputting an audio signal, and/or an input portion for receiving information input from the user.

The camera apparatus may process one or more image frames such as a still image(s) or a moving image (e.g., video) obtained by the image sensor in a video call mode or a photographing mode. The processed image frame may be displayed on the display panel 50 or stored in a memory.

The microphone may process an external sound signal into electrical voice data. The processed voice data may be variously utilized according to operations of (or an application being executed by) the display apparatus 1. Moreover, various noise removal algorithms for removing noise generated in a process of receiving an input corresponding to an external sound signal may be implemented in the microphone.

The main processor may control an operation of the display apparatus 1 corresponding to information input through an input apparatus. The input apparatus may include a mechanical input means or a touch input means such as a button, a dome switch, a jog wheel, a jog switch, etc. located on a rear surface or a side surface of the display apparatus 1. The touch input means may include the touchscreen layer of the display panel 50.

The sensor portion may include one or more sensors configured to sense one or more of: information in the display apparatus 1, surrounding environment information of the display apparatus 1, and/or user information; and generate a sensing signal corresponding to the sensed information. The main processor may control driving or an operation of the display apparatus 1 and may perform data processing, a function, or an operation related to an application installed on the display apparatus 1 based on the sensing signal. The sensor portion may include one or more of a proximity sensor, an illumination sensor, an acceleration sensor, a magnetic sensor, a gravity sensor (G-sensor), a gyroscope sensor, a motion sensor, a red-green-blue (RGB) sensor, an infrared sensor (IR sensor), a finger scan sensor, an ultrasonic sensor, an optical sensor, a battery gauge, an environment sensor (e.g., a barometer, a hygrometer, a thermometer, a radiation sensor, a heat sensor, a gas sensor, etc.), and a chemical sensor (e.g., an electronic nose, a healthcare sensor, a biometric sensor, etc.).

The proximity sensor includes a sensor that detects the presence or absence of an object approaching a predetermined detection surface or an object existing in the vicinity by using an electromagnetic field force or infrared rays without mechanical contact. Examples of the proximity sensor include a transmissive photoelectric sensor, a direct reflective photoelectric sensor, a mirror reflective photoelectric sensor, a high-frequency oscillation proximity sensor, a capacitive proximity sensor, a magnetic proximity sensor, an infrared proximity sensor, and the like. The proximity sensor may sense not only a proximity touch operation but also a proximity touch property, such as a proximity touch distance, a proximity touch direction, a proximity touch speed, a proximity touch duration, a proximity touch location, and a proximity touch movement state. The main processor may process data (or information) corresponding to the proximity touch operation and the proximity touch pattern sensed by the proximity sensor, and control to display visual information corresponding to the processed data on the display panel 50.

The ultrasonic sensor may recognize location information of an object by using ultrasonic waves. For example, the main processor may calculate a location of an object through information sensed by the optical sensor and a plurality of ultrasonic sensors. Because the speed of light and the speed of ultrasonic wave are different according to the location of the object, the location of the object may be determined from the time when the light reaches the optical sensor and the time when the ultrasonic wave reaches the ultrasonic sensor.

The output portion may be configured to generate an output related to visual, auditory, or tactile sense, and may include one or more of the display panel 50, a sound output portion, a haptic module, and an optical output portion.

The display panel 50 displays (outputs) information processed by the display apparatus 1. For example, the display panel 50 may display execution screen information of an application driven on the display apparatus 1, and/or user interface (UI) and graphic user interface (GUI) information according to the execution screen information. The display panel 50 may include a display layer that displays an image and a touchscreen layer that senses a touch input of the user. Accordingly, the display panel 50 may function an input apparatus that provides an input interface between the display apparatus 1 and the user, and may also function as an output portion that provides an output interface between the display apparatus 1 and the user.

The sound output portion may output sound data received from the wireless communicator or stored in the memory in a call signal reception mode, a call mode, a recording mode, a voice recognition mode, a broadcast reception mode, and the like. The sound output portion may output a sound signal related to a function (e.g., a call signal reception sound, a message reception sound, etc.) performed by the display apparatus 1. The sound output portion may also output sound data from a UI or application in response to operation from the user. The sound output portion may include a receiver and a speaker. At least one of the receiver and the speaker may be a sound generation apparatus attached to a lower portion of the display panel 50 to vibrate the display panel 50 to output sound. The sound generation apparatus may include a piezoelectric element or piezoelectric actuator that contracts and expands according to an electrical signal, or an exciter that generates a magnetic force by using a voice coil and vibrates the display panel 50.

The haptic module generates various tactile effects that the user may feel. The haptic module may provide vibration to the user as a tactile effect. An intensity and pattern of the vibration generated in the haptic module may be controlled by user configuration or settings of the main processor. For example, the haptic module may synthesize different vibrations and output the vibrations. In addition to vibration, the haptic module may generate various other tactile effects, including an effect by stimulation such as an arrangement of pins vertically moving with respect to a contacted skin surface, a spray force or suction force of air through a spray hole or a suction hole, grazing on the skin surface, contact of an electrode, an electrostatic force, etc., an effect reproducing the feeling of cold and warmth using an endothermic or exothermic element, and the like. The haptic module may not only deliver a tactile effect through direct contact, but may also be implemented to allow the user to feel the tactile effect through a muscle sensation such as a finger or an arm.

The optical output portion outputs a signal for notifying occurrence of an event by using light from a light source. Examples of the event that may occur in the display apparatus 1 may include message reception, call signal reception, a missed call, an alarm, a schedule notification, email reception, information reception through an application, and the like. The signal output by the optical output portion is implemented as the display apparatus 1 emits light having a single color or a plurality of colors to the front or rear surface of the display apparatus 1. The signal output may be terminated when the display apparatus 1 detects event confirmation of the user.

The interface portion serves as a path to various types of external devices connected to the display apparatus 1. The interface portion may include one or more of a wired/wireless headset port, an external charger port, a wired/wireless data port, a memory card port, a port for connection of an apparatus having an identification module, an audio input/output (I/O) port, a video I/O port, and an earphone port. The display apparatus 1 may perform appropriate control operation related to a connected external apparatus in response to the external apparatus being connected to the interface portion.

The memory stores data which supports various functions of the display apparatus 1. For example, the memory may store a plurality of application programs driven on the display apparatus 1, as well as pieces of data and commands for an operation of the display apparatus 1. Some of the plurality of applications may be downloaded from an external server through wireless communication. The memory may store an application for an operation of the main processor (such as an operating system and/or firmware), and may temporarily store input/output data, for example, data such as a phonebook, a message, a still image, a moving image, and the like. Also, the memory may store haptic data for vibration of various patterns provided to the haptic module and sound data about various sounds provided to the sound output portion. The memory may include one or more different types of storage mediums, such as flash memory type memory, a hard disk type memory, a solid state disk (SSD) type memory, a silicon disk drive (SDD) type memory, a multimedia card micro type memory, a card type memory (e.g., Secure Digital (SD) or eXtream Digital (XD) memory), a random access memory (RAM), a static random access memory (SRAM), a read-only memory (ROM), an electrically erasable programmable ROM (EEPROM), a programmable ROM (PROM), a magnetic memory, a magnetic disk, and/or an optical disk.

The power supply portion may receive external power and internal power, and supply power to each element included in the display apparatus 1 under the control by the main processor. The power supply portion may include a battery. Also, the power supply portion may include a connection port, and the connection port may be configured as an interface portion to which an external charger that supplies power for charging the battery is electrically connected. The power supply portion may be configured to charge the battery in a wireless manner without using the connection port. The battery may receive power from an external wireless power transmitter by an inductive coupling method based on a magnetic induction phenomenon and/or a magnetic resonance coupling method based on an electromagnetic resonance phenomenon. The battery may not overlap the main circuit board in a third direction (a Z-direction). The battery may overlap a battery hole of a bracket.

The lower cover 90 (referenced in FIG. 1) may be arranged under the main circuit board and the battery. The lower cover 90 may be fastened and fixed to the bracket. The lower cover 90 may determine a lower surface appearance of the display apparatus 1. The lower cover 90 may include plastic, a metal, or both plastic and a metal.

The digitizer 70 may include a body layer and a pattern layer arranged on the body layer, as described below. When the digitizer 70 is provided as one body, the body layer and/or the pattern layer arranged to overlap the folding area FA may crack.

Figure 8:
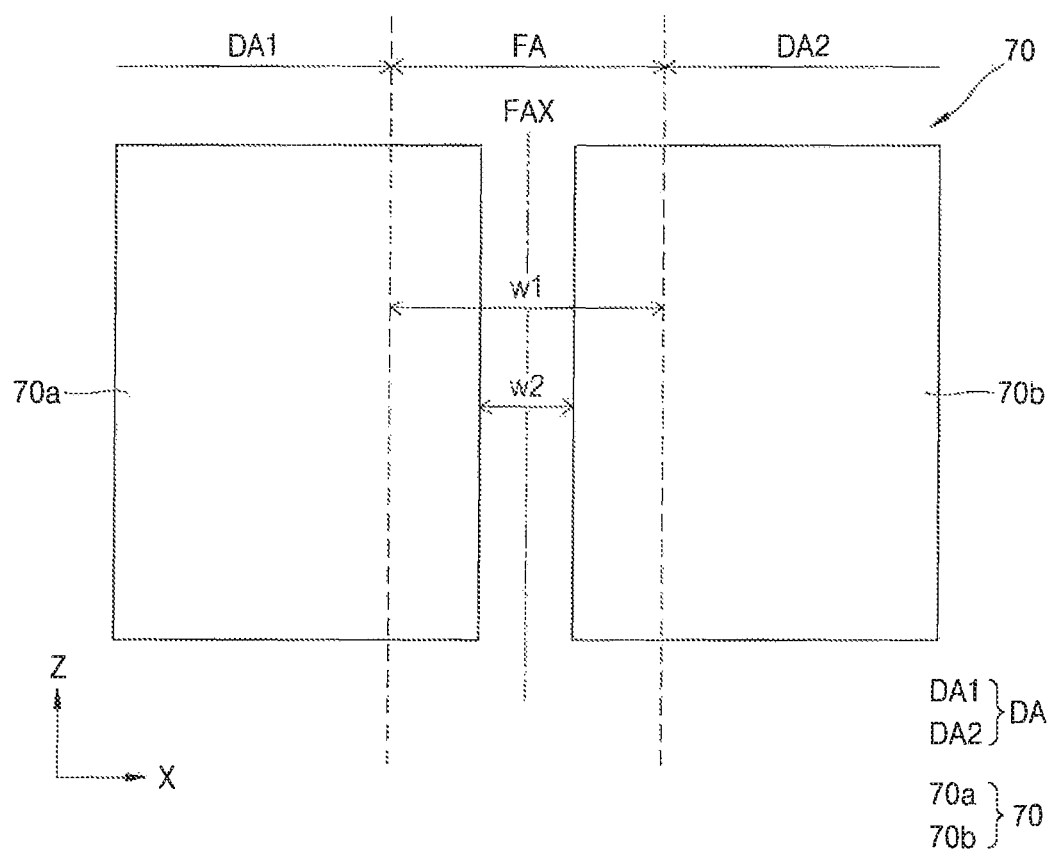
FIG. 8 is a schematic cross-sectional view of a digitizer of a display apparatus, according to an embodiment.

FIG. 8 is a schematic cross-sectional view of the digitizer 70 of the display apparatus, according to an embodiment.

Referring to FIG. 8, the digitizer 70 according to an embodiment may include a first portion 70a and a second portion 70b. As illustrated, the dimensions of the first portion 70a and the second portion 70b may be exaggerated. For example, the thicknesses of the first and second portions 70a and 70b in the Z direction may be much smaller than their widths in either the X or Y directions. In an embodiment, the first portion 70a of the digitizer 70 may at least partially overlap the first display area DA1, and the second portion 70b of the digitizer 70 may at least partially overlap the second display area DA2. Also, the first portion 70a of the digitizer 70 may at least partially overlap the folding area FA, and the second portion 70b of the digitizer 70 may at least partially overlap the folding area FA.

In an embodiment, the first portion 70a and the second portion 70b of the digitizer 70 may be spaced apart from each other in the first direction (the X-direction) with the folding axis FAX located therebetween. For example, the structure of the digitizer 70 may be a separate type instead of an integrated type. Because the digitizer 70 is provided as a separable structure, cracking of the body layer and/or the pattern layer arranged in the folding area FA may be prevented or minimized.

In an embodiment, the folding area FA may have a first width W1 in the first direction (the X-direction). Also, the first portion 70a and the second portion 70b spaced apart from each other with the folding axis FAX therebetween may have a second width W2 in the first direction (the X-direction). The first width W1 may be greater than the second width W2. Because the digitizer 70 is provided in a separated type and at least partially overlaps the folding area FA, signals may also be input via the folding area FA, thereby avoiding a significant area where input signals are not sensed.

Figure 9:
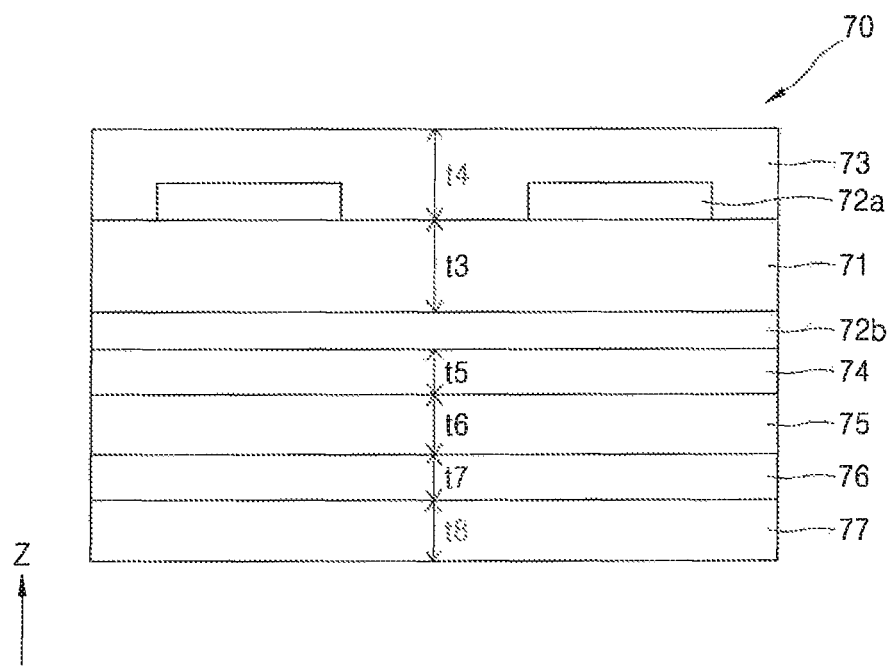
FIG. 9 is a schematic cross-sectional view of a digitizer according to an embodiment.

FIG. 9 is a schematic cross-sectional view of the digitizer 70 according to an embodiment.

Referring to FIG. 9, the digitizer 70 according to an embodiment may include one or more of a body layer 71, pattern layers 72a and 72b, a cover layer 73, a protective layer 74, a shielding layer 75, an adhesive layer 76, and a heat dissipation layer 77. In this case, the pattern layers 72a and 72b may include a first pattern layer 72a and a second pattern layer 72b.

In an embodiment, the body layer 71 may include a material such as paper phenolic (FR-2, FR-3, etc.), epoxy (FR-4, FR-5, G-2, G-11, etc.), polyimide, bismaleimide triazine resin (B.T) metal, ceramic, a halogen-free material, etc. For example, the body layer 71 may include FR-4, which is an insulator. FR-4 stands for flame retardant 4 and may include a glass fiber and a resin. Accordingly, the body layer 71 may include the glass fiber and the resin.

In an embodiment, the body layer 71 may ensure the stiffness of the digitizer 70 and/or increasing the surface quality of the digitizer 70. For example, because the digitizer 70 includes the body layer 71 including the glass fiber and the resin, the stiffness of the digitizer 70 may be increased, and the flatness of the surface of the digitizer 70 may be increased, thereby increasing the surface quality of the surface of the digitizer 70. Accordingly, unevenness of the surface of the digitizer 70 may be prevented.

In an embodiment, the body layer 71 may have a thickness of about 50 μm to about 80 μm (e.g., a third thickness t3). When the thickness of the body layer 71 is less than 50 μm, the stiffness of the digitizer 70 may be decreased, and thus the surface quality of the surface of the digitizer 70 may deteriorate. For example, the surface of the digitizer 70 may not be flat. On the other hand, when the thickness of the body layer 71 is greater than 80 μm, the thickness of the body layer 71 may be too thick, and the folding characteristics of the display apparatus may deteriorate. Also, when the thickness of the body layer 71 is greater than 80 μm, the entire thickness of the digitizer 70 may increase, and the folding characteristics of the display apparatus 1 including the digitizer 70 may deteriorate. For example, the radius of curvature of the display apparatus may increase. Accordingly, when the body layer 71 has the thickness of about 50 μm to about 80 μm (e.g., the third thickness t3), the stiffness of the digitizer 70 may be increased, the flatness of the surface of the digitizer 70 may be increased, the surface quality of the surface of the digitizer 70 may be increased, and the radius of curvature of the display apparatus may decrease, thereby increasing the folding characteristics of the display apparatus.

In an embodiment, the pattern layers 72a and 72b may be arranged on the body layer 71. The pattern layers 72a and 72b may be arranged on different surfaces of the body layer 71. For example, the first pattern layer 72a may be arranged on a first surface of the body layer 71, and the second pattern layer 72b may be arranged on a second surface opposite to the first surface of the body layer 71. In this case, the first surface may refer to a surface that is closer to the display panel 50 than the second surface. However, one or more embodiments are not necessarily limited thereto.

In an embodiment, the first pattern layer 72a and the second pattern layer 72b may be stacked on each other. In this case, the first pattern layer 72a and the second pattern layer 72b may be stacked on different layers, respectively. Hereinafter, for convenience of description, a case where the first pattern layer 72a and the second pattern layer 72b of the digitizer 70 are arranged on different surfaces of the same body layer 71 will be mainly described.

The first pattern layer 72a may be arranged on the first surface of the body layer 71, and the second pattern layer 72b may be arranged on the second surface opposite to the first surface of the body layer 71. The first pattern layer 72a may directly contact the first surface of the body layer 71, and the second pattern layer 72b may directly contact the second surface of the body layer 71. The first pattern layer 72a and the second pattern layer 72b may be formed by stacking pattern layers on the first surface and the second surface of the body layer, respectively, and by leaving a portion of the pattern layer while removing remaining portions of the pattern layers. For example, a larger portion of the first pattern layer 72a may be removed during its formation than the second pattern layer 72b.

In an embodiment, the first pattern layer 72a and the second pattern layer 72b may have a loop coil shape. The first pattern layer 72a and the second pattern layer 72b may be used to determine a location of an electronic pen by generating an induced current when the electronic pen contacts or hovers on the display apparatus. Accordingly, the first pattern layer 72a and the second pattern layer 72b may be arranged in different directions. For example, when the first pattern layer 72a is arranged in the first direction (the X-direction), the second pattern layer 72b may be arranged in the second direction (the Y-direction) different from the first direction (the X-direction). When the first pattern layer 72a is arranged in the second direction (the Y-direction), the second pattern layer 72b may be arranged in the first direction (the X-direction) different from the second direction (the Y-direction). In this case, the first pattern layer 72a and the second pattern layer 72b may be arranged to cross each other. However, one or more embodiments are not necessarily limited thereto.

In an embodiment, the pattern layers 72a and 72b may include a metal. For example, the pattern layers 72a and 72b may include Cu.

In an embodiment, the cover layer 73 may be arranged on the body layer 71. The cover layer 73 may cover the pattern layers 72a and 72b. For example, the cover layer 73 may directly cover the first pattern layer 72a, and indirectly overlap the second pattern layer 72b.

In an embodiment, the cover layer 73 may include a material such as paper phenolic (FR-2, FR-3, etc.), epoxy (FR-4, FR-5, G-2, G-11, etc.), polyimide, bismaleimide triazine resin (B.T) metal, ceramic, a halogen-free material, etc. For example, the cover layer 73 may include FR-4, which is an insulator. FR-4 stands for flame retardant 4, and may include a glass fiber and a resin. Accordingly, the cover layer 73 may include the glass fiber and the resin. In an embodiment, the cover layer 73 and the body layer 71 may include the same material. However, one or more embodiments are not necessarily limited thereto.

In an embodiment, the cover layer 73 may ensure the stiffness of the digitizer 70 and/or increasing the surface quality of the digitizer 70. For example, because the digitizer 70 includes the cover layer 73 including the glass fiber and the resin, the stiffness of the digitizer 70 may be increased, and the flatness of the surface of the digitizer 70 may be increased, thereby increasing the surface quality of the surface of the digitizer 70. For example, unevenness of the surface of the digitizer 70 may be prevented.

The cover layer 73 may be arranged on the pattern layers 72a and 72b to prevent or minimize oxidation of the pattern layers 72a and 72b by oxygen in the air, as well as to prevent or minimize the occurrence of a short circuit in the pattern layers 72a and 72b. For example, the cover layer 73 may be arranged on the first pattern layer 72a to prevent or minimize oxidation of the first pattern layer 72a by oxygen in the air and to prevent or minimize the occurrence of a short circuit in the first pattern layer 72a.

In an embodiment, the cover layer 73 may have a thickness of about 50 μm to about 80 μm (e.g., a fourth thickness t4). When the thickness of the cover layer 73 is less than 50 μm, the stiffness of the digitizer 70 may decrease and the surface quality of the surface of the digitizer 70 may deteriorate. For example, the surface of the digitizer 70 may not be flat. By contrast, when the thickness of the cover layer 73 is greater than 80 μm, the thickness of the cover layer 73 may be too thick, and the folding characteristics of the display apparatus may deteriorate. Also, when the thickness of the cover layer 73 is greater than 80 μm, the entire thickness of the digitizer 70 may increase, and the folding characteristics of the display apparatus may deteriorate. For example, the radius of curvature of the display apparatus may increase. Accordingly, when the cover layer 73 has the thickness of about 50 μm to about 80 μm (e.g., the fourth thickness t4), the stiffness of the digitizer 70 may be increased, the flatness of the surface of the digitizer 70 may be increased, the surface quality of the surface of the digitizer 70 may be increased, and the radius of curvature of the display apparatus may decrease, thereby increasing the folding characteristics of the display apparatus.

In an embodiment, the protective layer 74 may be arranged under the body layer 71. The protective layer 74 may be arranged under the pattern layers 72a and 72b. The protective layer 74 may include a resin.

The protective layer 74 may be arranged under the pattern layers 72a and 72b to prevent or minimize oxidation of the pattern layers 72a and 72b by oxygen in the air, and to prevent or minimize the occurrence of a short circuit in the pattern layers 72a and 72b. For example, the protective layer 74 may be arranged under the second pattern layer 72b to prevent or minimize oxidation of the second pattern layer 72b by oxygen in the air and to prevent or minimize the occurrence of a short circuit in the second pattern layer 72b.

In an embodiment, the protective layer 74 may have a thickness of about 10 μm to about 20 μm (e.g., a fifth thickness t5).

In an embodiment, the shielding layer 75 may be arranged under the protective layer 74. The shielding layer 75 may include magnetic metal powder (MMP). The shielding layer 75 may prevent a magnetic field which is emitted from the digitizer 70 from interfering with a magnetic field that may be generated by various circuits arranged under the digitizer 70. For example, the shielding layer 75 may prevent a magnetic field output from the digitizer 70 from being propagated in a downward direction, for example, a −Z direction. Accordingly, because the shielding layer 75 is arranged under the pattern layers 72a and 72b, detection sensitivity of an electronic pen may be increased, and electromagnetic noise may be shielded from adjacent elements.

In an embodiment, the shielding layer 75 may include a metal. For example, the shielding layer 75 may include Cu.

In an embodiment, the shielding layer 75 may have a thickness of about 20 μm to about 30 μm (e.g., a sixth thickness t6). When the thickness of the shielding layer 75 is less than 20 μm, the stiffness of the shielding layer 75 may decrease, and thus the stiffness of the digitizer 70 including the shielding layer 75 may decrease. Also, when the thickness of the shielding layer 75 is less than 20 um, electromagnetic noise may not be effectively shielded, and the detection sensitivity of the electronic pen may deteriorate. When the thickness of the shielding layer 75 is greater than 30 um, the thickness of the shielding layer 75 may be too thick, and the folding characteristics of the display apparatus may deteriorate. Also, when the thickness of the shielding layer 75 is greater than 30 um, the entire thickness of the digitizer 70 may increase, and the folding characteristics of the display apparatus may deteriorate. For example, the radius of curvature of the display apparatus may increase. Accordingly, when the shielding layer 75 has the thickness of about 20 um to about 30 um (e.g., the sixth thickness t6), the stiffness of the digitizer 70 may be increased, electromagnetic noise may be shielded, and the folding characteristics of the display apparatus may be increased. For example, the radius of curvature of the display apparatus may decrease.

In an embodiment, the heat dissipation layer 77 may be arranged under the shielding layer 75. In an embodiment, the adhesive layer 76 may be between the shielding layer 75 and the heat dissipation layer 77.

The heat dissipation layer 77 may adhere to the shielding layer 75 through the adhesive layer 76. The adhesive layer 76 may be include a PSA, an OCA, or the like. However, one or more embodiments are not necessarily limited thereto.

The adhesive layer 76 may have a thickness of about 10 um to about 30 um (e.g., a seventh thickness t7).

The heat dissipation layer 77 may be arranged under the adhesive layer 76. The heat dissipation layer 77 may transfer heat generated from the digitizer 70 to the outside. In this case, the heat dissipation layer 77 may include a metal having a relatively high heat transfer efficiency.

The heat dissipation layer 77 may include a metal. For example, the heat dissipation layer 77 may include copper. When the heat dissipation layer 77 includes a metal, the heat dissipation layer 77 may have a thickness of about 50 um to about 80 um (e.g., an eighth thickness t8). When the thickness of the heat dissipation layer 77 is less than 50 um, heat generated in the digitizer 70 is not effectively discharged to the outside, and the temperature of the digitizer 70 may increase, and the digitizer 70 may be damaged. On the other hand, when the thickness of the heat dissipation layer 77 is greater than 80 um, the thickness of the heat dissipation layer 77 may be too thick, and the folding characteristics of the display apparatus may deteriorate. Also, when the thickness of the heat dissipation layer 77 is greater than 80 um, the entire thickness of the digitizer 70 may increase, and the folding characteristics of the display apparatus may deteriorate. For example, the radius of curvature of the display apparatus may increase. Accordingly, when the heat dissipation layer 77 has the thickness of about 50 um to about 80 um (e.g., the eighth thickness t8), the stiffness of the digitizer 70 may be increased, heat generated in the digitizer 70 may be discharged to the outside, and the folding characteristics of the display apparatus may be increased. For example, the radius of curvature of the display apparatus may decrease.

Figure 10:
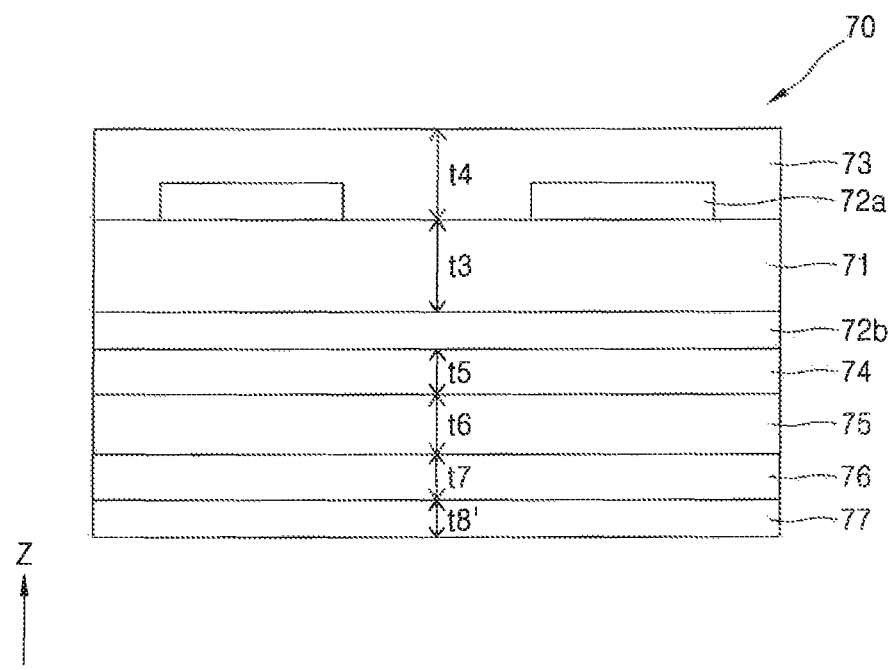
FIG. 10 is a schematic cross-sectional view of a digitizer according to an embodiment.

FIG. 10 is a schematic cross-sectional view of the digitizer 70 according to an embodiment. The embodiment of FIG. 10 differs from the embodiment of FIG. 9 in that the heat dissipation layer 77 includes graphite. For example, the heat dissipation layer 77 in the embodiment illustrated in FIG. 10 may not include a metal. In FIG. 10, like reference numerals as those in FIG. 9 denote like members, and thus a repeated description thereof will be omitted.

Referring to FIG. 10, in an embodiment, the heat dissipation layer 77 may include graphite having high thermal conductivity in a planar direction. In an embodiment, when the heat dissipation layer 77 includes graphite, the heat dissipation layer 77 may have a thickness of about 17 um to about 30 um (e.g., an eight' thickness t8'). Accordingly, when the heat dissipation layer 77 includes graphite, the heat dissipation layer 77 may have a smaller thickness than a heat dissipation layer 77 that includes a metal (e.g., copper). However, when the heat dissipation layer 77 includes graphite, manufacturing cost of the digitizer 70 may increase as compared to when the heat dissipation layer 77 includes a metal (e.g., copper).

When the thickness of the heat dissipation layer 77 including graphite is less than 17 um, the thickness of the heat dissipation layer 77 may be too small to effectively discharge heat generated in the digitizer 70 to the outside, and thus the temperature of the digitizer 70 may increase and the digitizer 70 may be damaged. By contrast, when the thickness of the heat dissipation layer 77 including graphite is greater than 30 um, the manufacturing cost of the digitizer 70 may increase. Accordingly, when the thickness of the heat dissipation layer 77 including graphite is about 17 um to about 30 um, heat generated in the digitizer 70 may be discharged to the outside, and the thickness of the digitizer 70 may decrease so that the folding characteristics of the display apparatus may be increased. For example, the radius of curvature of the display apparatus may decrease.

When the digitizer 70 includes a polymer resin (e.g., polyimide), there is a case where the surface quality of the digitizer 70 deteriorates due to the pattern layers 72a and 72b of the digitizer 70. For example, the body layer 71 and/or the cover layer 73 are arranged on/under the pattern layers 72a and 72b, and when the body layer 71 and/or the cover layer 73 include polyimide having a low modulus, a curved surface may be formed on the surface of the body layer 71 and/or the cover layer 73 by the pattern layers 72a and 72b of the digitizer 70, and therefore a curved surface may be formed on the surface of the digitizer 70 including the same. For example, the flatness of the body layer 71 and/or the cover layer 73 may be reduced by the pattern layers 72a and 72b of the digitizer 70, and the flatness of the digitizer 70 including the same may be reduced. Because an image generated by the display panel 50 is visually recognized as a curved shape by the user due to the influence of the curved surface of the digitizer 70, the display quality may deteriorate.

A copper alloy having high stiffness may be arranged over and/or under the digitizer 70 to increase the flatness of the display panel 50. However, when the copper alloy having high stiffness is arranged over and/or under the digitizer 70, the display apparatus has a complicated stack structure.

Figure 11:
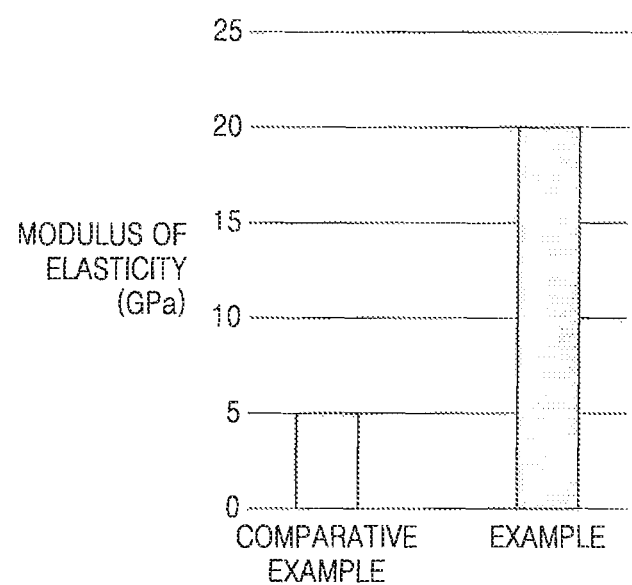
FIG. 11 is a graph for comparing the stiffness of a digitizer in an example and a comparative example.

FIG. 11 is a graph for comparing the stiffness of a digitizer in an example and a comparative example. In FIG. 11, the comparative example illustrates a case where the digitizer is formed of a polymer resin (e.g., polyimide), and the example illustrates a case where the digitizer is formed of a glass fiber and a resin. For example, in FIG. 11, the comparative example corresponds to a case where a body layer and a cover layer of the digitizer include polyimide, and the example corresponds to a case where the body layer and the cover layer of the digitizer include the glass fiber and the resin. Hereinafter, for convenience of description, a case where the digitizer includes the polymer resin will be referred to as a flexible digitizer (comparative example), and a case where the digitizer includes the glass fiber and the resin will be referred to as a rigid digitizer (example).

Referring to FIGS. 2, 9, and 11, it should be noted that an elastic coefficient of the flexible digitizer (comparative example) is about 5 GPa, whereas an elastic coefficient of the rigid digitizer (example) is about 20 GPa. Accordingly, it should be noted that the rigid digitizer (example) has an elastic modulus of the digitizer as a whole higher than that of the flexible digitizer (comparative example).

In general, a high elastic modulus of a material indicates high stiffness of the material. Therefore, the stiffness of the rigid digitizer (example) may be greater than the stiffness of the flexible digitizer (comparative example).

Accordingly, when the digitizer includes a glass fiber and a resin, the stiffness of the digitizer may be increased. For example, when the body layer and the cover layer of the digitizer include the glass fiber and the resin, the stiffness of the digitizer itself may be increased.

Also, because the stiffness of the digitizer itself is increased, a copper alloy, that is arranged on and/or under the digitizer to otherwise preserve the flatness of a display panel of a non-rigid digitizer, may be provided thin or even omitted, and thus the folding characteristics of the display apparatus may be increased. For example, the radius of curvature of the display apparatus may decrease.

In an embodiment, when the display apparatus includes a rigid digitizer, the digitizer and a lower plate may be combined as one element so that a rigid digitizer having a thickness of about 200 µm to about 350 µm may be arranged under the display panel 50, and an upper plate having a thickness of about 50 µm to about 80 µm may be arranged over the rigid digitizer.

Figure 12:
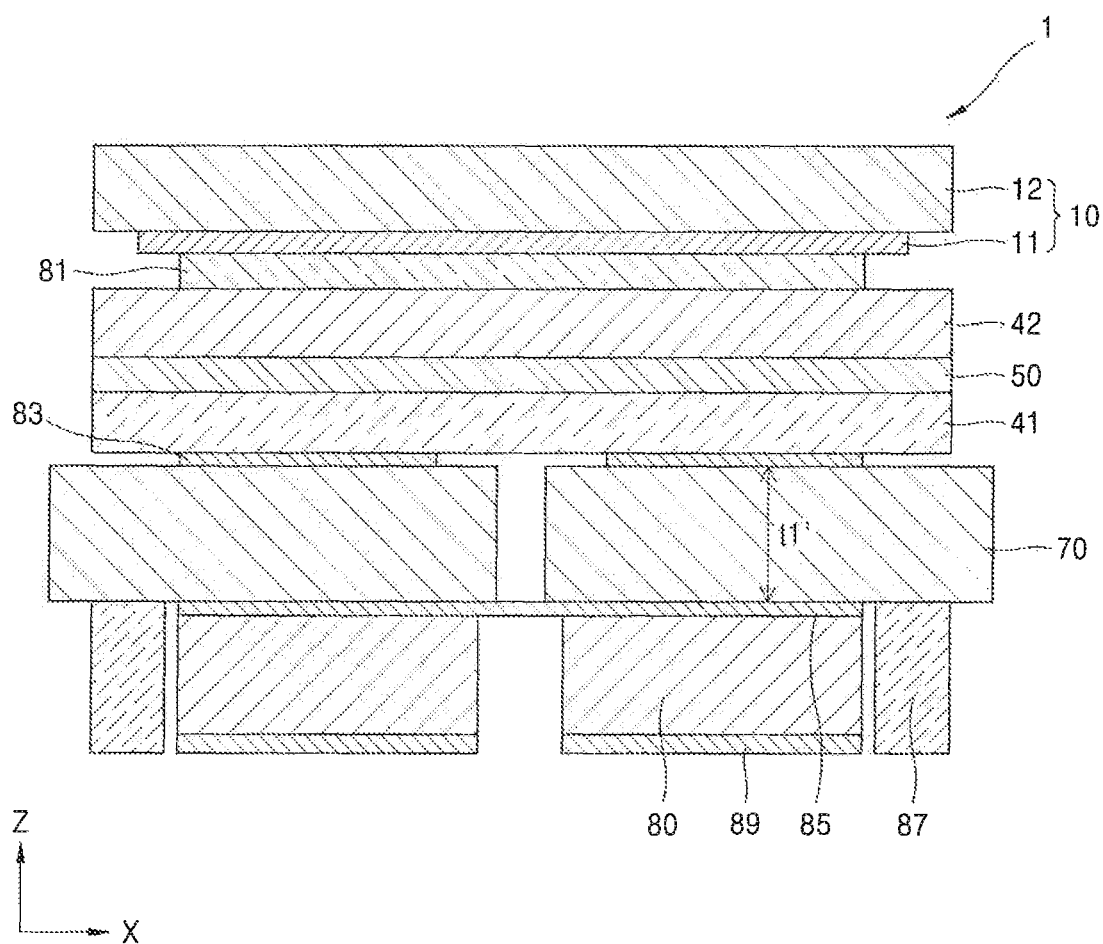
FIG. 12 is a schematic cross-sectional view of a display apparatus according to an embodiment.

FIG. 12 is a schematic cross-sectional view of the display apparatus 1 according to an embodiment.

The embodiment of FIG. 12 is different from the embodiment of FIG. 2 in that the plate 60 is omitted and the digitizer 70 is implemented with an increased thickness. In FIG. 12, like reference numerals as those of FIG. 2 denote like elements.

Referring to FIG. 12, in an embodiment, a digitizer 70 may be arranged under the display panel 50. In this case, because the digitizer 70 includes a pattern layer, the digitizer 70 may sense a signal input by an external electronic pen or the like.

In an embodiment, the digitizer 70 may be attached to the panel protection member 41 through the second adhesive member 83. The second adhesive member 83 may include a transparent adhesive member such as a PSA or an OCA film.

The third adhesive member 85 may be arranged under the digitizer 70. The third adhesive member 85 may include a PSA, an OCA film, or TPU.

The third adhesive member 85 may be located under the digitizer 70 to prevent or minimize introduction of foreign materials between two portions of the digitizer 70 which are spaced apart from each other in the first direction (the X-direction) with respect to (or around) the folding axis FAX. This will be described in more detail with reference to FIGS. 13 and 14.

When the plate 60 provided between the display panel 50 and the digitizer 70 is omitted, the thickness of the digitizer 70 may be slightly increased to support the display panel 50.

The digitizer 70 according to an embodiment may have a thickness of about 265 µm to about 425 µm (e.g., a first' thickness t'). When the thickness of the digitizer 70 is less than 265 µm, the stiffness of the digitizer 70 may decrease and the surface quality of the surface of the digitizer 70 may deteriorate. For example, the surface of the digitizer 70 may not be flat. By contrast, when the thickness of the digitizer 70 is greater than 425 µm, the thickness of the digitizer 70 is too thick, and the folding characteristics of the display apparatus 1 including the digitizer 70 may deteriorate. For example, the radius of curvature of the display apparatus may increase. Accordingly, when the digitizer 70 has the thickness of about 265 µm to about 425 µm (e.g., the first' thickness t'), the stiffness of the digitizer 70 may be increased, and thus the surface quality of the surface of the digitizer 70 may be increased, and the folding characteristics of the display apparatus may by be increased.

Figure 13:
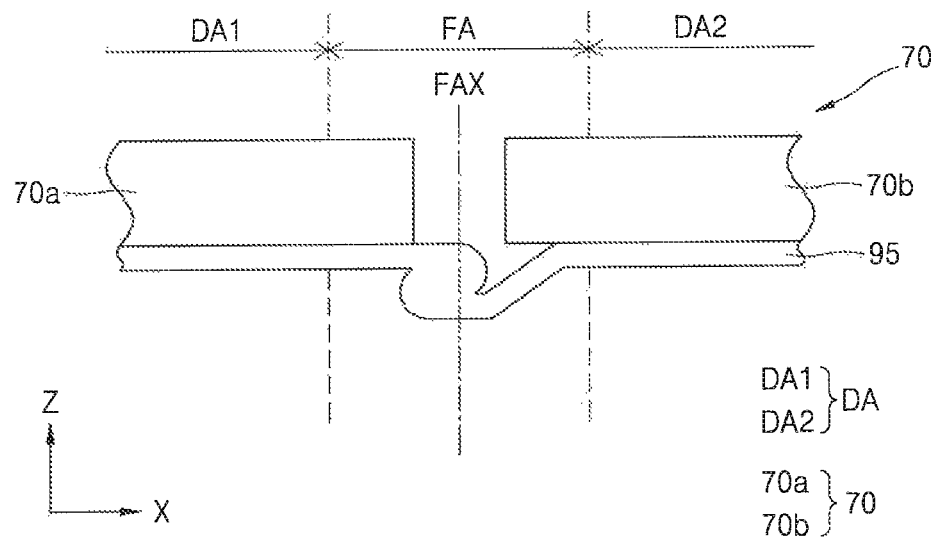
FIGS. 13 and 14 are schematic cross-sectional views of a display apparatus according to an embodiment.
Figure 14:
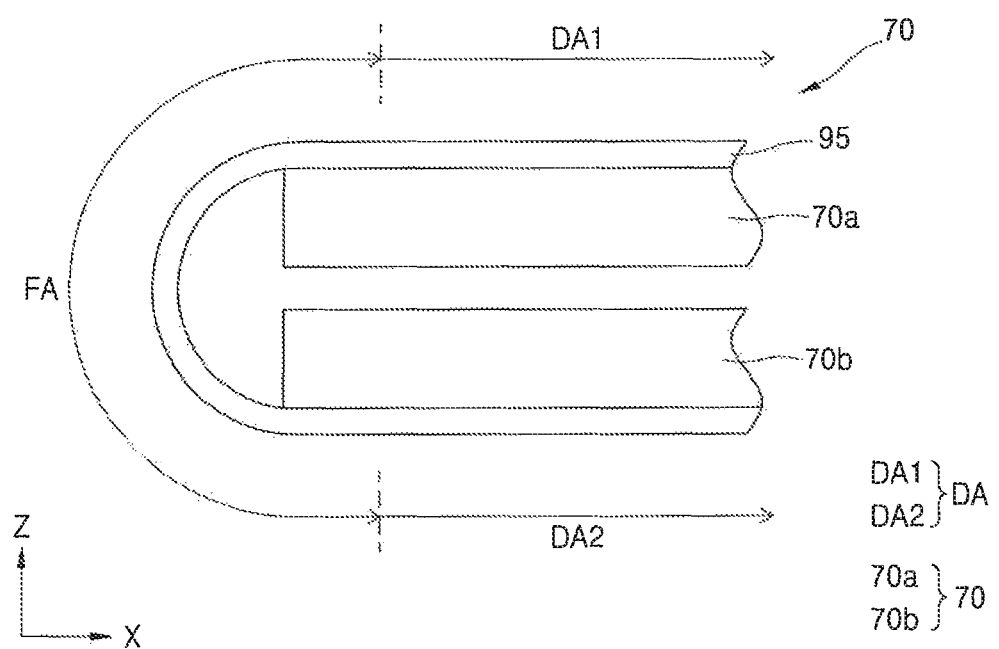

FIGS. 13 and 14 are schematic cross-sectional views of the display apparatus according to an embodiment. FIG. 13 is a cross-sectional view illustrating a case where the display apparatus is unfolded, and FIG. 14 is a cross-sectional view illustrating a case where the display apparatus is folded.

Referring to FIGS. 13 and 14, the digitizer 70 according to an embodiment may include the first portion 70a and the second portion 70b. In an embodiment, the first portion 70a of the digitizer 70 may at least partially overlap the first display area DA1, and the second portion 70b of the digitizer 70 may at least partially overlap the second display area DA2. Also, the first portion 70a of the digitizer 70 may partially overlap the folding area FA, and the second portion 70b of the digitizer 70 may partially overlap the folding area FA.

In an embodiment, the first portion 70a and the second portion 70b of the digitizer 70 may be spaced apart from each other in the first direction (the X-direction) with the folding axis FAX located therebetween. For example, the digitizer 70 may be provided with a separated structure instead of an integrated structure. Because the digitizer 70 is provided as a separable structure, cracking of the body layer and/or the pattern layer arranged in the folding area FA may be prevented or minimized.

In an embodiment, a connection member 95 may be arranged under the first portion 70a and the second portion 70b of the digitizer 70. In an embodiment, the first portion 70a and the second portion 70b of the digitizer 70 may be connected by the connection member 95. In an embodiment, the connection member 95 may include an FPCB.

Foreign materials may be introduced between the first portion 70a and the second portion 70b of the digitizer 70 which are spaced apart from each other with the folding axis FAX located therebetween, and thus the digitizer 70 and elements arranged over the digitizer 70 may be damaged, or the detection sensitivity may deteriorate, or the driving characteristics may deteriorate due to the foreign materials.

Accordingly, the connection member 95 is arranged under the first portion 70a and the second portion 70b of the digitizer 70 which are spaced apart from each other with the folding axis FAX located therebetween, and the connection member 95 connects the first portion 70a and the second portion 70b of the digitizer 70, so that damage to the digitizer 70 and the elements arranged over the digitizer 70 due to the introduction of the foreign materials between the first portion 70a and the second portion 70b may be prevented or minimized, and deterioration of the detection sensitivity or deterioration of the driving characteristics due to the foreign materials may be prevented or minimized.

In an embodiment, when the display apparatus is unfolded, the connection member 95 may be folded under one of the first portion 70a and the second portion 70b of the digitizer 70.

Figure 15:
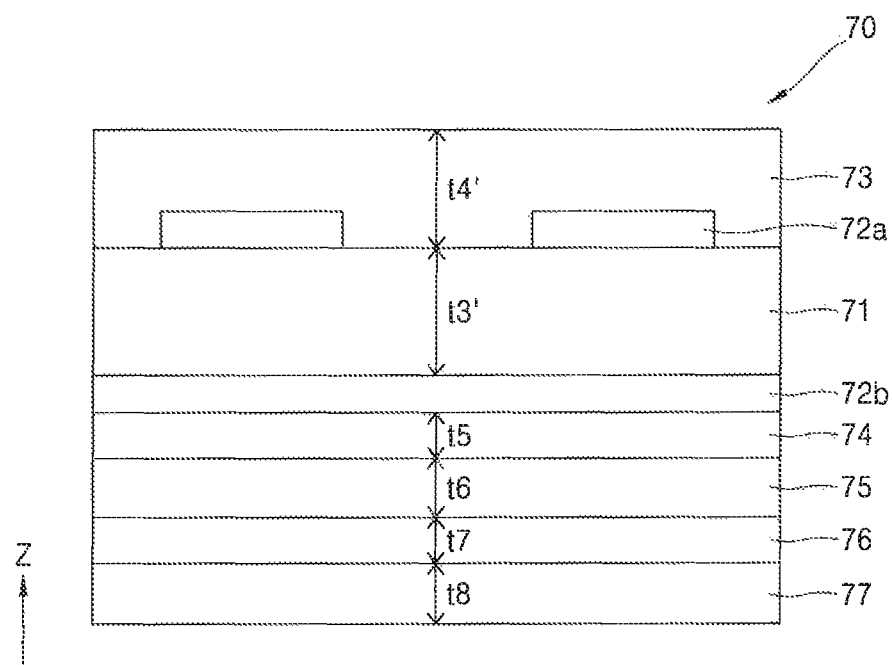
FIG. 15 is a schematic cross-sectional view of a digitizer according to an embodiment.

FIG. 15 is a schematic cross-sectional view of the digitizer 70 according to an embodiment. For example, the embodiment of FIG. 15 is a cross-sectional view schematically illustrating the digitizer 70 of FIG. 12. The embodiment of FIG. 15 is different from the embodiment of FIG. 9 in that the body layer 71 and the cover layer 73 are implemented thicker than the body layer 71 and cover layer 73 in the embodiment of FIG. 9. In FIG. 15, like reference numerals as those of FIG. 9 denote like elements.

In the embodiment of FIG. 15, the plate 60 provided between the display panel 50 and the digitizer 70 is omitted, and the thickness of the digitizer 70 may be slightly increased to support the display panel 50. Accordingly, the thicknesses of the body layer 71 and the cover layer 73 of the digitizer 70 may be greater than those of the embodiment of FIG. 2.

Referring to FIG. 15, in an embodiment, the body layer 71 may have a thickness of about 80 μm to about 100 μm (e.g., a third' thickness t3'). When the thickness of the body layer 71 is less than 80 μm, the stiffness of the digitizer 70 may decrease and the surface quality of the surface of the digitizer 70 may deteriorate. For example, the surface of the digitizer 70 may not be flat. By contrast, when the thickness of the body layer 71 is greater than 100 μm, the thickness of the body layer 71 may be too thick, and the folding characteristics of the display apparatus may deteriorate. Also, when the thickness of the body layer 71 is greater than 100 μm, the entire thickness of the digitizer 70 may increase, and the folding characteristics of the display apparatus may deteriorate. For example, the radius of curvature of the display apparatus may increase. Accordingly, when the body layer 71 has the thickness of about 80 μm to about 100 μm (e.g., the third' thickness t3'), the stiffness of the digitizer 70 may be increased, the flatness of the surface of the digitizer 70 may be increased, the surface quality of the surface of the digitizer 70 may be increased, and the radius of curvature of the display apparatus may decrease, thereby increasing the folding characteristics of the display apparatus.

In an embodiment, the pattern layers 72a and 72b may be arranged on the body layer 71. In detail, the pattern layers 72a and 72b may be arranged on different surfaces of the body layer 71. For example, the first pattern layer 72a may be arranged on the first surface of the body layer 71, and the second pattern layer 72b may be arranged on the second surface opposite to the first surface of the body layer 71. In this case, the first surface may refer to the surface closer to the display panel 50 than the opposite surface of the body layer 71. However, one or more embodiments are not necessarily limited thereto.

In an embodiment, the cover layer 73 may be arranged on the body layer 71. The cover layer 73 may cover the pattern layers 72a and 72b. For example, the cover layer 73 may cover the first pattern layer 72a. In an embodiment, the cover layer 73 and the body layer 71 may include the same material. However, one or more embodiments are not necessarily limited thereto.

The cover layer 73 may ensure the stiffness of the digitizer 70 and/or increasing the surface quality of the digitizer 70. For example, because the digitizer 70 includes the cover layer 73 including a glass fiber and a resin, the stiffness of the digitizer 70 may be increased, and the flatness of the surface of the digitizer 70 may be increased, thereby increasing the surface quality of the surface of the digitizer 70. That is, unevenness of the surface of the digitizer 70 may be prevented.

In an embodiment, the cover layer 73 may have a thickness of about 80 μm to about 100 μm (e.g., a fourth' thickness t4'). When the thickness of the cover layer 73 is less than 80 μm, the stiffness of the digitizer 70 may decrease and the surface quality of the surface of the digitizer 70 may deteriorate. For example, the surface of the digitizer 70 may not be flat. By contrast, when the thickness of the cover layer 73 is greater than 100 μm, the thickness of the cover layer 73 may be too thick, and thus the folding characteristics of the display apparatus may deteriorate. Also, when the thickness of the cover layer 73 is greater than 100 μm, the entire thickness of the digitizer 70 may increase, and the folding characteristics of the display apparatus may deteriorate. For example, the radius of curvature of the display apparatus may increase. Accordingly, when the cover layer 73 has the thickness of about 80 μm to about 100 μm (e.g., the fourth' thickness t4'), the stiffness of the digitizer 70 may be increased, the flatness of the surface of the digitizer 70 may be increased, the surface quality of the surface of the digitizer 70 may be increased, and the radius of curvature of the display apparatus may decrease, thereby increasing the folding characteristics of the display apparatus.

In an embodiment, the protective layer 74 may be arranged under the body layer 71. The protective layer 74 may be arranged under the pattern layers 72a and 72b. The protective layer 74 may include a resin. In an embodiment, the protective layer 74 may have a thickness of about 10 μm to about 20 μm (e.g., the fifth thickness t5).

The shielding layer 75 may be arranged under the protective layer 74. The shielding layer 75 may have a thickness of about 20 μm to about 30 μm (e.g., the sixth thickness t6).

The heat dissipation layer 77 may be arranged under the shielding layer 75. The adhesive layer 76 may be between the shielding layer 75 and the heat dissipation layer 77. The heat dissipation layer 77 may include a metal (copper) or graphite. For example, when the heat dissipation layer 77 includes a metal (copper), the heat dissipation layer 77 may have a thickness of about 50 um to about 80 um (e.g., the eighth thickness t8). Alternatively, in an embodiment, when the heat dissipation layer 77 includes graphite, the heat dissipation layer 77 may have a thickness of about 17 um to about 30 um (e.g., the ninth thickness t9).

In an embodiment, the adhesive layer 76 may include a transparent adhesive member such as a PSA or an OCA film. The adhesive layer 76 may have a thickness of about 10 um to about 30 um (e.g., the seventh thickness t7).

Alternatively, the adhesive layer 76 and the cover layer 72 may include the same material. For example, the adhesive layer 76 may include FR-4, which is an insulator. Accordingly, the adhesive layer 76 may include a glass fiber and a resin. In an embodiment, when the adhesive layer 76 includes the glass fiber and the resin, the adhesive layer 76 may have a thickness of about 50 μm.

In an embodiment, because the digitizer includes the first portion 70a and the second portion 70b spaced apart from each other in the first direction (the X-direction) with the folding area FA located therebetween (e.g., the digitizer is provided in a separated type), cracking of the digitizer may be prevented or minimized.

In an embodiment, because the digitizer includes the FR4 material, the stiffness of the digitizer as a whole is increased so that deterioration of the surface quality of the digitizer due to the pattern layer of the digitizer may be prevented or minimized. For example, because the body layer and/or the cover layer of the digitizer include a glass fiber and a resin, the stiffness of the digitizer as a whole may be increased and therefore prevent a curved surface from being formed on the surface of the digitizer by the pattern layer of the digitizer, thereby increasing the visibility of the display apparatus.

In an embodiment, because a heat dissipation layer of the digitizer includes graphite, heat generated in the digitizer may be easily discharged to the outside.

According to the one or more embodiments as described above, a digitizer and a display apparatus having increased surface quality may be provided.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure including the following claims.

What is claimed is:

1. A display apparatus comprising:
a digitizer; and
a display panel disposed on the digitizer and including display elements,
wherein the digitizer comprises:
a body layer including a glass fiber or a resin; and
a pattern layer arranged on the body layer,l
wherein the digitizer has a separated structure including a first portion and a second portion spaced apart from each other with respect to a folding axis, with a gap disposed between the first portion and the second portion.

2. The display apparatus of claim 1, wherein the body layer has a thickness of about 50 μm to about 80 μm.

3. The display apparatus of claim 1, wherein the digitizer further comprises a cover layer disposed on the body layer, and wherein the cover layer has a thickness of about 50 μm to about 80 μm.

4. The display apparatus of claim 3, wherein the cover layer and the body layer include the same material.

5. The display apparatus of claim 3, wherein the digitizer further comprises a heat dissipation layer disposed under the body layer.

6. The display apparatus of claim 5, wherein the heat dissipation layer includes a metal and has a thickness of about 50 μm to about 80 μm.

7. The display apparatus of claim 5, wherein the heat dissipation layer includes graphite and has a thickness of about 17 μm to about 30 μm.

8. The display apparatus of claim 5, wherein the digitizer further comprises a shielding layer disposed between the body layer and the heat dissipation layer.

9. The display apparatus of claim 1, wherein the display panel further comprises a display area and a folding area.

10. The display apparatus of claim 9, further comprising a plate disposed between the display panel and the digitizer, wherein the plate has a thickness of about 50 μm to about 80 μm.

11. The display apparatus of claim 10, wherein the plate includes a folding structure, wherein the folding structure at least partially overlaps the folding area in a thickness direction of the digitizer.

12. The display apparatus of claim 9, wherein the display area includes a first display area and a second display area spaced apart from each other with the folding area therebetween.

13. The display apparatus of claim 12, wherein the first portion at least partially overlapping the first display area in a thickness direction of the digitizer, and the second portion at least partially overlaps the second display area in the thickness direction.

14. The display apparatus of claim 13, wherein digitizer has a thickness of about 200 μm to about 350 μm.

15. A digitizer comprising:
a body layer including a glass fiber or a resin;
a pattern layer arranged on the body layer; and
a first portion and a second portion spaced apart from each other with respect to a folding axis,
wherein a gap is disposed between the first portion and the second portion.

16. The digitizer of claim 15, wherein the body layer has a thickness of about 50 μm to about 80 μm.

17. The digitizer of claim 15, further comprising a cover layer disposed on the body layer and having a thickness of about 50 μm to about 80 μm.

18. The digitizer of claim 17, wherein the cover layer and the body layer include a same material.

19. The digitizer of claim 18, wherein the digitizer further comprises a heat dissipation layer disposed under the body layer.

20. The digitizer of claim 15, wherein the digitizer has a thickness of about 200 μm to about 350 μm.

* * * * *